(12) United States Patent
Vancha et al.

(10) Patent No.: US 10,734,048 B2
(45) Date of Patent: Aug. 4, 2020

(54) SENSING MEMORY CELLS USING ARRAY CONTROL LINES

(71) Applicant: SanDisk Technologies LLC, Addison, TX (US)

(72) Inventors: Yadhu Vamshi Vancha, Livermore, CA (US); James Hart, Cedar Park, TX (US); Jeffrey Koon Yee Lee, Fremont, CA (US); Tz-Yi Liu, Palo Alto, CA (US); Ali Al-Shamma, San Jose, CA (US); Yingchang Chen, Cupertino, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 16/000,816

(22) Filed: Jun. 5, 2018

(65) Prior Publication Data
US 2019/0371380 A1 Dec. 5, 2019

(51) Int. Cl.
*G11C 8/08* (2006.01)
*G11C 7/08* (2006.01)
*G11C 7/12* (2006.01)

(52) U.S. Cl.
CPC ............ *G11C 8/08* (2013.01); *G11C 7/08* (2013.01); *G11C 7/12* (2013.01)

(58) Field of Classification Search
CPC ............ G11C 8/08; G11C 7/08; G11C 7/12
USPC ........................... 365/189.011–189.2
See application file for complete search history.

(56) References Cited

U.S. PATENT DOCUMENTS

| 5,604,711 A | 2/1997 | Cheung |
| 6,667,900 B2 | 12/2003 | Lowrey et al. |
| 7,583,542 B2 | 9/2009 | Gasquet |
| 8,274,841 B2* | 9/2012 | Shimano ............... G11C 8/04 365/189.011 |
| 9,013,939 B2 | 4/2015 | Yamagami |
| 9,449,666 B2 | 9/2016 | Chen et al. |
| 2003/0198101 A1 | 10/2003 | Pio |
| 2009/0147569 A1 | 6/2009 | Kim |
| 2011/0149652 A1 | 6/2011 | Lee |
| 2012/0113731 A1* | 5/2012 | Shimano ............... G11C 8/04 365/189.15 |
| 2014/0071776 A1 | 3/2014 | Chong et al. |

FOREIGN PATENT DOCUMENTS

| WO | 2011149823 A1 | 12/2011 |
| WO | 2015031360 | 3/2015 |
| WO | 2017136438 A1 | 8/2017 |

* cited by examiner

*Primary Examiner* — Harry W Byrne
(74) *Attorney, Agent, or Firm* — Volpe and Koenig, P.C.

(57) ABSTRACT

One or more control lines other than those used to activate a non-volatile memory cell may be used to sense a data value of the cell. For example, an apparatus may include a selection circuit that selects, based on an address corresponding to a non-volatile memory cell included an array of non-volatile memory cells, a word line coupled to the non-volatile memory cells to activate the non-volatile memory cell. An amplifier circuit may sense a data value stored in the non-volatile memory cell based on a sense signal having a voltage level based on voltage levels of one or more other word lines of the array of non-volatile memory cells. In another example, a data value of a non-volatile memory cell coupled to a word line may be sensed based on the voltage levels of one or more dummy sense lines within the array.

10 Claims, 15 Drawing Sheets

SENSING MEMORY CELLS USING ARRAY CONTROL LINES

BACKGROUND

Technical Field

The embodiments described herein generally relate to memory circuits, and more particularly, to sensing data values stored in memory cells.

Description of the Relevant Art

Computer systems include processors and multiple memory circuits that store software programs or applications, as well as data being operated on by the processors. Such memories may vary in storage capacity as well as access time. In some computing systems, memories may be arranged in a hierarchical fashion, with smaller, faster memory circuits coupled directly to the processors, and larger, slower memory circuits coupled to the processors via a memory controller communicating with the processors via a communication link.

The memory circuits included in computer systems may be volatile or non-volatile. Volatile memory circuits require application of power in order to maintain previously stored data. Once power is removed from a volatile memory, previously stored data is lost. Non-volatile memory circuits, however, have the ability to maintain previously stored data in the absence of power.

Generally, volatile memory circuits are higher performing, i.e., faster access times, than non-volatile memory circuits. Moreover, the endurance to repeated data storage operations is greater for volatile memory circuits than non-volatile memory circuits. As such, volatile memory circuits are better suited to main or cache memory applications within a computer system, while non-volatile memory circuits are generally employed for secondary or long-term storage due to their lower performance resulting from challenges in sensing data store in non-volatile memory cells.

SUMMARY

Various embodiments of a non-volatile memory circuit are disclosed. Broadly speaking, an apparatus and a method are contemplated in which a non-volatile memory cell array includes a plurality of control lines and control circuitry may be configured to activate a non-volatile memory cell using one or more of the control lines. The control circuitry may be further configured to select one or more control lines other than those used to activate the non-volatile memory cell and sense a data value of the non-volatile memory cell using a voltage level of a sense signal that is based on voltage levels of the one or more other control lines.

In one embodiment, the one or more control lines include a word line coupled to the non-volatile memory cell. In such embodiments, a selection circuit may be configured to select, based on an address corresponding to a non-volatile memory cells included in an array of non-volatile memory cells, a word line coupled to the non-volatile memory cell to activate the non-volatile memory cell. A decoder circuit may be configured to select, based on the address, a sense signal whose voltage level is based on voltage levels of one or more other word lines of the array of non-volatile memory cells. The selection circuit may be further configured, in response to selecting the word line and prior to selecting the sense signal, to float the one or more other word lines used to generate the sense signal.

In another embodiment, an analog control circuit may be configured to generate a select bias signal for selected word lines and a deselect bias signal for deselected word lines. The selection circuit may be further configured to couple each word line of the array of non-volatile memory cells to the deselect bias signal in response to a pre-charge operation. Additionally, the selection circuit may be further configured to subsequently couple the word line to the select bias signal, in response to selection of the word line.

Figure 1:
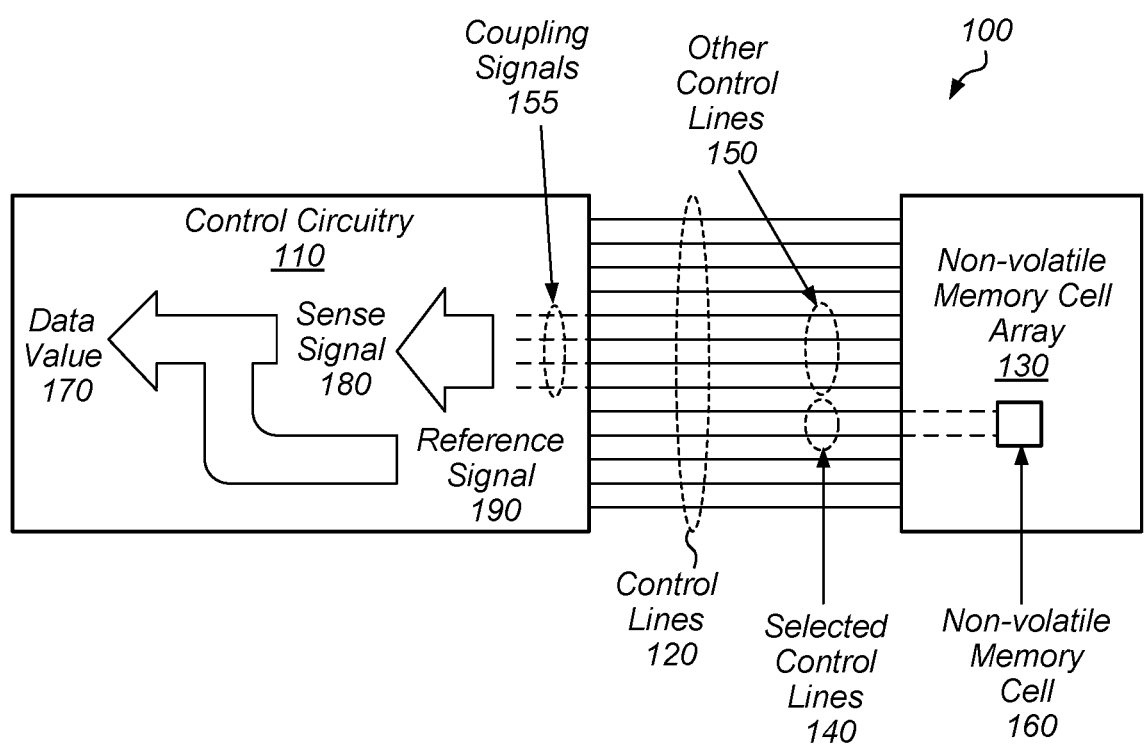
FIG. 1 is a generalized block diagram depicting an embodiment of a memory circuit.

While the disclosure is susceptible to various modifications and alternative forms, specific embodiments thereof are shown by way of example in the drawings and will herein be described in detail. It should be understood, however, that the drawings and accompanying detailed description are not intended to limit the disclosure to the particular form illustrated, but on the contrary, the intention is to cover all modifications, equivalents and alternatives falling within the spirit and scope of the present disclosure, including those defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

To provide persistent storage, computer systems may employ non-volatile memory circuits, which are able to maintain previously stored data in the absence of a power supply voltage. A non-volatile memory circuit may use one of various non-volatile storage mechanisms and cell array topologies. For example, a non-volatile memory circuit may use a NAND flash architecture, a cross point phase-change memory cell architecture, and the like.

Once data has been stored in a non-volatile memory circuit, the previously received data may be retrieved using a process commonly referred to as "sensing." In some non-volatile memory circuits, sensing is performed using a selected word line. Leakage current in the array before a word line is selected may be compared to a current through the selected path after the word line has been selected and a non-volatile memory cell has been activated. Based on results of the comparison, a data value stored in the non-volatile memory cell may be determined.

In order to determine that data value, the above-referenced sensing method relies on the array leakage current being less than the current through the path. If the array leakage current it too large compared to the current through the path, the data value cannot be reliably determined. Moreover, the speed with which the data value may be sensed is based on a time constant of the selected path through the non-volatile memory cell array. The time constant results from parasitic resistances and capacitances along the selected path. Analog circuits for providing the voltage levels necessary to activate the non-volatile memory cell may further increase the load. This arrangement may be further complicated by low gate drive of transistors in word line selection circuits, which increases the resistance along the selected path. The embodiments illustrated in the drawings and described below may provide techniques for sensing data stored in a non-volatile memory cell using array control lines, while improving signal-to-noise ratio and reducing access time.

An embodiment of a memory system is illustrated in FIG. 1. As shown, non-volatile memory circuit 100 includes control circuitry 110 and non-volatile memory cell array 130, which has a plurality of control lines, denoted as control lines 120. Control circuitry 110 is coupled to non-volatile memory cell array 130 by control lines 120.

In various embodiments, a non-volatile memory cell array includes multiple metal lines. Some of the lines are coupled to multiple non-volatile memory cells and are used in activating a non-volatile memory cell for access (either a read or write access). Lines used in this fashion are commonly referred to as word lines and bit lines. It is noted that bit lines may be oriented orthogonally to word lines in the non-volatile memory cell array.

There may also be metal lines included in the non-volatile memory cell array that are not coupled to any non-volatile memory cells. In some instances, such lines may be used to route power supply signals through the non-volatile memory cell array. Another example of metal lines that are not coupled to any non-volatile memory cells are so-called "array sense lines" that are used in sensing data values of the non-volatile memory cells. Such array sense lines may run parallel to the word lines in some implementations.

The present disclosure refers to using one or more "control lines" to activate a particular non-volatile memory cell, while using one or more other control lines to sense a data value of the particular cell. As used in the present disclosure, a "control line" is a line in a non-volatile memory cell array that either 1) is coupled to and is used to activate a particular non-volatile memory cell (e.g., a word line or bit line), or 2) is not coupled to the particular cell, but which is used to sense a data value of the particular cell (e.g., an array sense line).

Non-volatile memory cell array 130 includes multiple non-volatile memory cells. For example, in the present embodiment, non-volatile memory cell array 130 includes non-volatile memory cell 160. As used and described herein, a non-volatile memory cell is a device or circuit that can maintain, without the application of a power source, a state indicative of stored data. For example, non-volatile memory cell 160 may be a flash memory cell, a magneto resistive memory cell, a phase-change memory cell, or any other suitable type of non-volatile memory cell.

As described below in more detail, the non-volatile memory cells included in non-volatile memory cell array 130 may be coupled to control lines 120 in a cross point fashion, where a given non-volatile memory cell is coupled to a pair of control lines. In some embodiments, the pair of control lines included in selected control lines 140 may correspond to a word line and a bit line in non-volatile memory cell array 130. (Such a pair of control lines is illustrated in FIG. 1.) As previously noted, control lines 120 may also include one or more array sense lines that are not be coupled to any non-volatile memory cells included in non-volatile memory cell array 130.

Control circuitry 110 is circuitry configured to activate a non-volatile memory cell using one or more control lines, and to determine a data value of that cell using one or more other control lines. Such a determination may be made using a "sense signal" described below that is based, at least in part, on the one or more other control lines.

For example, control circuitry 110 may activate non-volatile memory cell 160 using selected control lines 140, which are coupled to non-volatile memory cell 160. In some embodiments, control circuitry 110 may be configured to change voltage levels of the one or more control lines from an initial voltage level set during a pre-charge operation, to voltage levels that activate the non-volatile memory cell. In some cases, voltage levels of different ones of the one or more control lines may be set to different voltage levels in order to activate the non-volatile memory cell.

Once a non-volatile memory cell has been activated, a voltage level of one of the selected control lines may change based on a data value stored in the non-volatile memory cell. For example, the voltage level of a particular one of the selected control lines (e.g., a word line) may increase as the impedance of the non-volatile memory cell provides a conduction path from the particular one of the selected control lines to another one of the selected control lines, which is at a higher voltage level than the particular one of the selected control lines. In some cases, the magnitude of a resultant change in the voltage level of the particular one of the selected control lines corresponds to a particular data value. Thus, a first, non-zero magnitude might represent a first data value while a second, non-zero magnitude might represent a second data value. In other cases, however, one data value stored in a non-volatile memory cell may generate a given voltage level change on a selected control line upon activation, while another data value stored in the non-volatile memory cell may result in no change in the voltage level of the selected control line. Accordingly, in some cases, a data value for the memory cell may correspond to the amount of a voltage change on a selected control line, while in other cases, the data value may correspond to the presence (or not) of a voltage change on the selected control line.

It is noted that a non-volatile memory cell may generate changes in other electrical characteristics of a selected control line besides a change in a voltage level of the selected control line. For example, a change in current flowing through a selected control line may result from activation of a non-volatile memory cell. As with the change in a voltage level of a selected control line, a change, resulting from activation of a non-volatile memory cell, in any of the various electrical characteristics may correspond to a data value stored in the non-volatile memory cell.

In any event, since the control lines are both capacitively and inductively coupled to each other within a memory circuit, a change in an electrical characteristic such as the voltage level of the particular one of the selected control lines induces a change in the electrical characteristic of other (deselected) control lines. The capacitive load and resistance to other control lines may be less than the particular one of the selected control lines, however, since the other control lines are not coupled to circuits for generating the activation voltages. The reduced load and resistance may therefore allow the electrical characteristic change to develop more quickly. By employing one or more of the other control lines, their respective changes in electrical characteristics (e.g., voltage levels) may be used to sense a data value of the activated cell. In many instances, this may reduce a time to sense the data value of the non-volatile memory cell.

Activation of a memory cell using one or more selected control lines 140 may thus result in changes in electrical characteristics of one or more other (deselected) control lines, such as control lines 150. The signal on each of these other control lines is referred to herein as a "coupling signal," since it results from a coupled or induced change in an electrical characteristic of the deselected control line. As noted, in some cases, this change may be a voltage change. As another example, a change in a current flowing through a selected control line may generate a change in a magnetic field surrounding the selected control line. Such a change in the magnetic field may induce a change in another current flowing in a deselected control line. In this manner, the present disclosure contemplates that one or more coupling signals may be used to sense a data value in a non-volatile memory cell that is not connected to the control lines having the coupling signals. As shown in FIG. 1, other control lines 150 may have coupling signals on them (these are denoted using reference numeral 155). Accordingly, coupling signals 155 delivered by control lines 150 are used to generate sense signal 180. This arrangement can be said to allow a memory circuit to determine a data value for a particular cell based on control lines that are not coupled to that cell. For example, in some embodiments, coupling signals may be detected on one or more word lines that are adjacent to the word line whose data value is being sensed.

These coupling signals may in turn be used to determine a "sense signal" 180. As used and described herein, a "sense signal" is a signal that is based on one or more coupling signals on respective deselected control lines, and which is used to determine a data value 170 of a particular non-volatile memory cell on one or more selected control lines. For example, sense signal 180 may have a voltage level that is based on voltage levels of one or more coupling signals on respective deselected control lines such as control lines 150. Since the voltage level of sense signal 180 is based on one more coupling signals, the voltage level of sense signal 180 corresponds to a data value stored in a non-volatile memory cell that generated a change in a voltage level of a selected control line, which, in turn, generated coupling signals in deselected control lines of a non-volatile memory cell array. Sense signal 180 is thus used to generate a data value 170 which corresponds to a data value of non-volatile memory cell 160.

The present disclosure contemplates various ways of determining sense signal 180 from coupling signals on deselected control lines such as control lines 150. In some embodiments, sense signal 180 may be selected from one or more deselected control lines 120. For example, as described further below, a subset of deselected control lines 120 (such as control lines 150) may be selected and combined such as in a wired-OR fashion to produced sense signal 180. The subset of deselected control lines for a particular set of selected control lines 140 may be determined in some cases by selecting a set of adjacent control lines. As one example, coupling signals on the word lines on either side of a selected word line might be selected and used to generate a sense signal for that word line.

In other embodiments, sense signal 180 may be generated, for example by routing coupling signals through an amplifier circuit or other active component. As is understood, an active component is one that must be powered to make them work, in contrast to passive components such as resistors, inductors, capacitors, etc. For example, an active component may generate an output signal that is an amplified version of one or more input signals. In contrast, when a signal is passed through a passive component, the signal is attenuated. Amplification provided by an active component may thus cause a gain in voltage levels of the one or more input signals, a gain in current levels of the one or more input signals, or any suitable combination thereof. Many different levels of gain provided by an active component are possible and may be based on a particular application in which the active component is used. For example, to buffer a signal, a gain level of one (commonly referred to as "unity gain") may be employed in order to allow the signal to traverse a longer distance or drive a larger load without changing an amplitude of the signal. In short, sense signal 180 may be determined in various ways, including by selecting between multiple coupling signals and generating such a signal from coupling signals using active components.

In some embodiments, sense signal 180 is determined using only coupling signals detected on deselected control lines—that is, sense signal is not determined using an electrical characteristic of selected control lines 140. In these embodiments, control circuitry 110 may be said to "infer" a data value in cell 160 using these deselected control lines because it is not using electrical characteristics of selected control lines 140. In other embodiments, however, sense signal 180 is determined based not only on coupling signals detected on deselected control lines, but also on an electrical characteristic of control lines 140.

Control circuitry 110 may further be configured, in response to activating the non-volatile memory cell using the one or more control lines, to float the one or more other control lines. By floating a control line, a load on the control line is reduced, thereby allowing a coupling signal to develop on the floated control line more quickly. As used and described herein, floating a signal or line means decoupling the signal or line from a circuit that is providing an electric potential between the signal or line and ground, or is injecting a current into the signal or line. For example, in non-volatile memory circuit 100, control circuitry 110 may float other control lines 150 in response to activating non-volatile memory cell 160. In order to float other control lines 150, control circuitry 110 may decouple other control lines 150 from a voltage source included in control circuitry 110 (not shown).

Moreover, to sense the data value of the non-volatile memory cell, control circuitry 110 is further configured to select at least one control line of the one or more other control lines. As will be described below in more detail, voltage of multiple control lines or a voltage level of just a single control line may be used to sense data value 170. In some embodiments, control circuitry 110 may include a decoder circuit configured to select a particular control line of selected control lines 140 for use in sensing data value 170.

As described above, control circuitry 110 is configured to perform a variety of functions. To perform such functions, control circuitry 110 may, in various embodiments, include decoder circuits, amplifier circuits, as well as timing and state machine circuits. In some cases, control circuitry 110 may also include voltage reference generator circuits, such as, e.g., band gap reference circuits, to provide the voltage levels on selected control lines 140 used to activate non-volatile memory cell 160.

The apparatus depicted in FIG. 1 illustrates the general use of array control lines to sense a value of a non-volatile memory cell. The present disclosure contemplates the use of different types of control lines in different embodiments. For example, in one set of embodiments, a selected control line of a particular type (e.g., a word line) is used to activate a particular memory cell, and one or more other control lines of the particular type (e.g., one or more other word lines) are used to sense a data value of the particular memory cell. In another set of embodiments, a selected control line of a particular type (e.g., a word line) is used to activate a particular memory cell, and one or more other control lines of a different type (e.g., array sense lines) are used to sense a data value of the particular memory cell.

Figure 2:
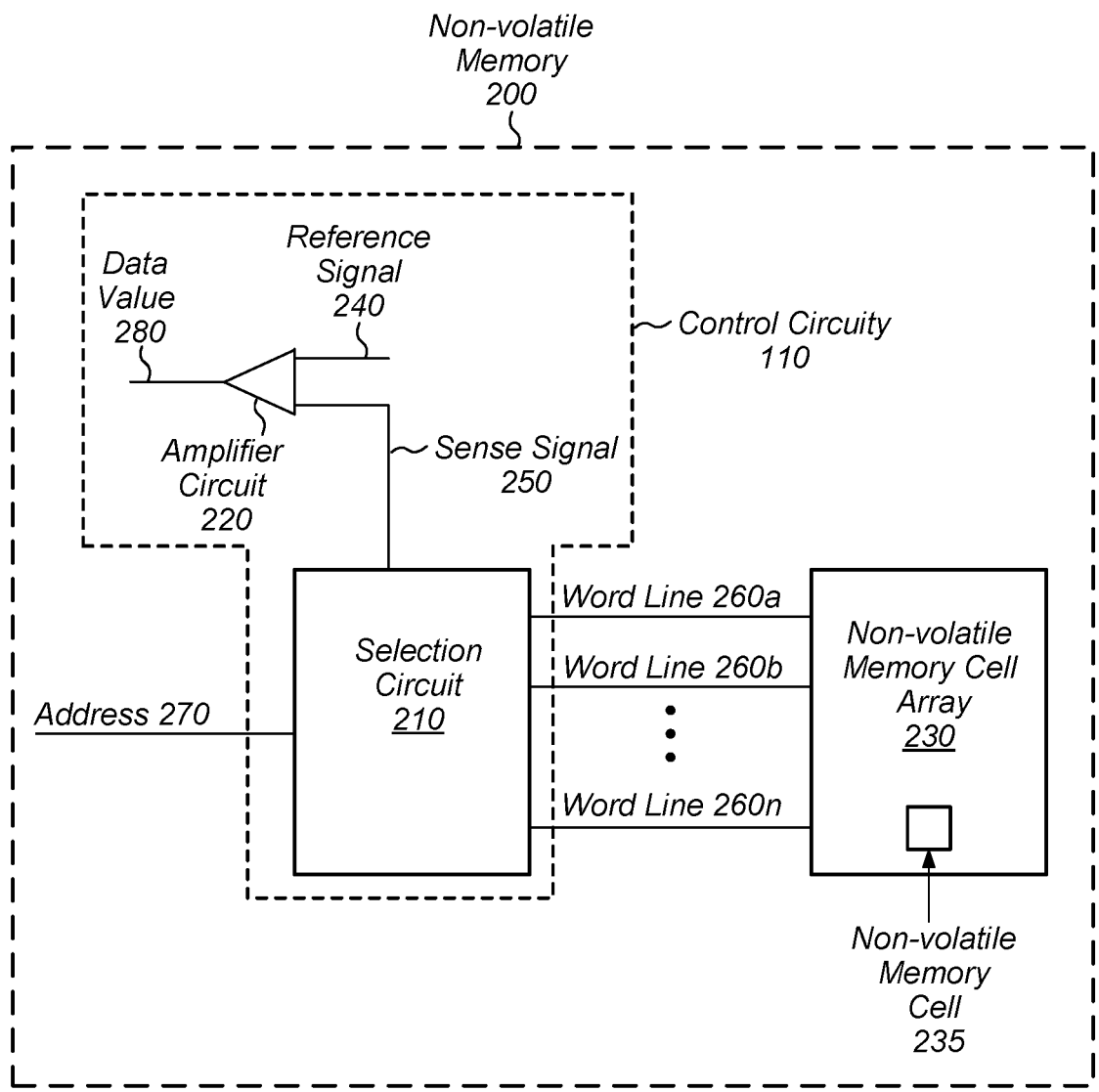
FIG. 2 is a block diagram illustrating another embodiment of a memory circuit.

Turning now to FIG. 2, non-volatile memory circuit 200 includes non-volatile memory cell array 230, and control circuitry 110, which includes selection circuit 210 and amplifier circuit 220. Non-volatile memory cell array 230 includes multiple non-volatile memory cells that include a non-volatile memory cell that is coupled to a word line. For example, in the depicted embodiment, non-volatile memory cell array includes non-volatile memory cell 235 coupled to word line 260a. Non-volatile memory cell 235 may, in various embodiments, be a phase-change memory cell, or any other suitable non-volatile memory cell.

The word lines and non-volatile memory cells included in non-volatile memory cell array 230 may be arranged in one of various topologies. For example, on-volatile memory cell array 230 may be arranged such that a given non-volatile memory cell of the array of non-volatile memory cells is coupled to a corresponding one of word lines of the array of non-volatile memory cells and a corresponding one of a plurality of bit lines. By arranging the non-volatile memory cells in such a fashion, a combination of a single bit line and a single word line are used to activate a single non-volatile memory cell, while leaving other non-volatile memory cells inactive. This type of topology is commonly referred to as a "cross point array."

Selection circuit 210 is configured to select, based on an address corresponding to the non-volatile memory cell, the word line to activate the non-volatile memory cell. For example, if the value of address 270 corresponds to non-volatile memory cell 235, then selection circuit 210 will select word line 260n in order to activate non-volatile memory cell 235. Selection circuit 210 will, in various embodiments, leave voltage levels of word lines 260a and 260b at a pre-charge voltage level.

In some embodiments, selection circuit 210 is further configured, in response to selecting the word line and prior to selecting the sense signal, to float the one or more other word lines used to generate the sense signal. Selection circuit 210 may decouple deselected word lines from a voltage source in order to float the deselected word lines. A voltage level of the voltage source may correspond to a pre-charge voltage level or any other suitable voltage level that does not activate non-volatile memory cells included in non-volatile memory cell array 230.

Prior to performing an access to non-volatile memory cell array 230, word lines, bit lines, and other signals in non-volatile memory cell circuit 200 may be set to known voltage levels in a process called "pre-charging." Once the pre-charge operation has been completed, the access to the non-volatile memory cell may begin by selecting a particular word line to activate the non-volatile memory cell. In order to activate the non-volatile memory cell, selection circuit 210 sets the selected word line to a particular voltage level, which may be a voltage level different than a voltage level of a power supply for the non-volatile memory circuit.

In order to create the necessary voltage levels, selection circuit 210 may, in some embodiments, include an analog control circuit configured to generate a select bias signal for selected word lines and a deselect bias signal for deselected word lines. In such cases, selection circuit 210 may be further configured to couple each word line of the array of non-volatile memory cells to the deselect bias signal, in response to a pre-charge operation, subsequently couple the particular word line to the select bias signal, in response to selecting the word line, and float the one or more other word lines by decoupling the one or more other word lines from the deselect bias signal, in response to selecting the word line. In some embodiments, the one or more other word lines are decoupled from the deselect bias signal by deactivating pass gates coupled between the one or more other word lines and the deselect bias signal.

In other embodiments, selection circuit 210 may be further configured to generate the sense signal based on voltage levels of the one or more other word lines, but not on a voltage level of the selected word line. As described above, when a word line is selected, it is coupled to a select bias signal to activate the non-volatile memory cell. The circuit that generates the select bias signal increases the load on the selected word line, thereby slowing its response to the change in voltage level induced by the activated non-volatile memory cell. By not using the selected word line, a time required to sense the data value may be reduced.

Moreover, a voltage level of the select bias signal may be different than a voltage of the deselected bias signal, which is coupled to deselected word lines. In order to use both the selected word line and the deselected word lines, signals of different DC bias levels would typically have to be combined prior to being used by an amplifier circuit. Rather than attempting such a combination, the selection circuit can ignore the voltage level of the selected word line, thereby reducing circuit complexity.

In the above description, selection circuit 210 uses deselected word lines to generate sense signal 250. Other embodiments, however, may use deselected bit lines to generate a sense signal. Just as an activation of a non-volatile memory cell causes a change in a voltage level of a selected word line, the activation may also cause a change in a voltage level of a selected bit line. Such a change in the voltage level of the selected bit line can couple into deselected bit lines, generating voltage level changes on the deselected bit lines. Just as with deselected word lines, the deselected bit lines may be used to generate a sense signal.

Although a single sense signal, e.g., sense signal 250 is depicted, in other embodiments, more than one sense signal may be employed to determine the data value. To accomplish this, selection circuit 210 may include a decoder circuit configured to select, based on the address, a second sense signal having a voltage level based on voltage levels of one or more other word lines of the array of non-volatile memory cells. In such an embodiment, the amplifier circuit is further configured to sense the data value stored in the non-volatile memory cell based on the sense signal and the second sense signal. In various embodiments, an improved signal-to-noise ratio, for the data being sensed, may be achieved using multiple sense signals.

Amplifier circuit 220 is configured to sense a data value stored in the non-volatile memory cell based on a sense signal having a voltage level based on voltage levels of one or more other word lines of the array of non-volatile memory cells. To sense the data value, amplifier circuit 220 may compare a voltage level of sense signal 250 to reference signal 240. In some embodiments, the voltage level of reference signal 240 may be selected such that it is between possible voltage levels on sense signal 250 that are indicative of different data values. For example, if one data value corresponds to a voltage level of 1 volt on sense line 250, and another data value corresponds to a voltage level at or near ground potential, then the voltage level of reference signal 240 may be selected to be 500 mV or any other suitable voltage level between 1 volt and ground potential.

As described below in more detail, different numbers of other word lines may be used during the sensing process. For example, in some embodiments, each of the one or more word lines is adjacent to the word line. Thus, if an array has word lines 0-7 arranged such that word line 5 is physically situated in between word lines 4 and 6, word lines 4 and 6 are "adjacent" to word line 5. Word line 7 would be considered "non-adjacent" to word line 5. Alternatively, the one or more other word lines include a first plurality of word lines adjacent to one side of the word line. For purposes of this disclosure, a group of word lines is considered to be adjacent to a selected word line if the group includes a word line that is adjacent to the selected word line. Conversely, a group of word lines is non-adjacent to a selected word line if none of the word lines in the group is adjacent to the selected word line. It is noted that not all of the word lines used during the sensing process need to be located on the same side of the word line. For example, in another embodiment, the one or more other word lines include a second plurality of word lines adjacent to another side of the word line.

In some embodiments, dedicated array sense lines may be added to non-volatile memory cell array 230 to facilitate the sensing of a data value stored in a given non-volatile memory cell. The array sense lines may physically similar in width and length to word lines and be oriented parallel to the word lines. Unlike word lines, however, array sense lines are not coupled to any non-volatile memory cells in order to reduce the capacitive load on the array sense line.

In cases where array sense lines are included in non-volatile memory array, the one or more other word lines includes at least one array sense line that is not coupled to any non-volatile memory cells. Since the capacitive load on the array sense line is less than that of a word line, when a voltage level of a selected word line changes, in response to activation of a non-volatile memory cell, a larger voltage change is coupled onto the array sense line. Moreover, the reduced capacitive load allows for more rapid development of a signal on the array sense line. By including an array sense line with the other word lines to generate the sense signal, a larger signal may be developed more quickly, thereby reducing access time and improving sensing accuracy.

Figure 3:
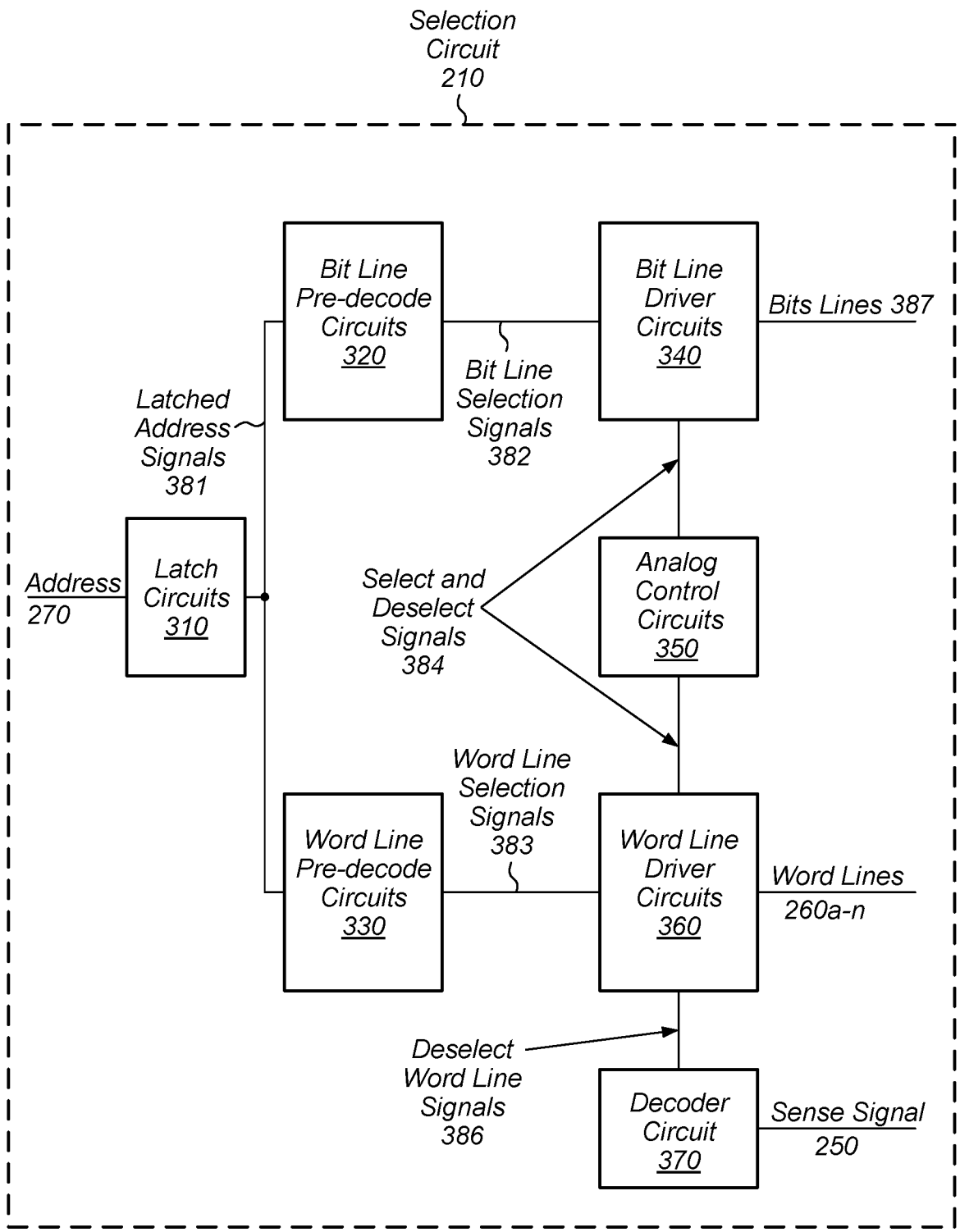
FIG. 3 illustrates a block diagram depicting an embodiment of a selection circuit.

A block diagram depicting an embodiment of selection circuit 210 is illustrated in FIG. 3. As shown, selection circuit 210 includes latch circuits 310, bit line pre-decode circuits 320, word line pre-decode circuits 330, bit line driver circuits 340, analog control circuits 350, word line driver circuits 360, and decoder circuit 370.

Latch circuits 310 are configured to sample and hold a value of address 270 to generate latched address signals 381. In various embodiments, latch circuits 310 may include a respective latch circuit for each data bit included in address 270. Latch circuits 310 may, in some embodiments, sample the value of address 270 in response to an assertion of a clock or other timing signal (not shown). In some cases, latch circuits 310 may generate true and complement versions of the latched address bits.

Bit line pre-decode circuits 320 are configured to generate bit line selection signals 382 using latched address signals 381. Bit line selection signals 382 are used by bit line driver circuits 340 to select and activate particular ones of bit lines 387. In various embodiments, bit line pre-decoder circuits 320 may use a subset of latched address signals 381. Bit line pre-decode circuits 320 may, in various embodiments, include any suitable combination of logic gates, transistors, and the like, configured to assert a particular one of bit line selection signals 382 based on a given value of address 270.

Word line pre-decode circuits 330 are configured to generate word line selection signals 383 using latched address signals 381. In some cases, word line pre-decode circuits may use a subset of latched address signals 381, different than the subset of latched address signals 381 used by bit line pre-decode circuits 320. As described below with reference to FIG. 5, word line pre-decode circuits 330 include any suitable combination of logic gates, transistors, and the like, configured to assert a particular one of word line selection signals 383 based on a given value of address 270.

Analog control circuits 350 are configured to generate a select bias signal for selected word lines and a deselect bias signal for deselected word lines. In some embodiments, analog control circuits 350 include any suitable combination of reference voltage generator circuits, current mirrors, bias circuits, and the like, configured to generated select and deselect signals 384. In some cases, analog control circuits 350 may be disabled during sleep or low power operating modes of non-volatile memory circuit 200. Analog control circuits 350 may, in some embodiments, receive an external reference voltage signal in lieu of, or in addition to, generating its own reference voltage signal.

Bit line driver circuits 340 are configured to select one of bit lines 387 for activation based on bit line selection signals 382. In various embodiments, bit line driver circuits 340 may set respective voltage levels of each bit line of bit lines 387 to a particular voltage level (as provided in select and deselect signals 384) as part of a pre-charge operation performed by non-volatile memory circuit 200. In some embodiments, bit line driver circuits 340 may include multiple transistors, pass gates, or other suitable circuits used to selectively couple bit lines 387 to particular ones of select and deselect signals 384 based on bit line selection signals 382.

Word line driver circuits 360 are configured to select one of word lines 260a-n for activation based on word line selection signals 383. In some embodiments, word line driver circuit 360 may set respective voltage levels of each bit line of word lines 260a-n to a particular voltage level (as provided in select and deselect signals 384) as part of a pre-charge operation performed by non-volatile memory circuit 200. As described below in more detail in regard to FIG. 4, word line driver circuits 360 may include multiple transistor, pass gates, or other suitable circuits used to selectively couple word lines 260a-n to particular ones of select and deselect signals 384 based on word line selection signals 383.

Decoder circuit 370 is configured to generate sense signal 250 based on voltage levels of one or more other word lines of word lines 260a-n. To generate sense signals 250, decoder circuit 370 may select a single one of the other word lines based on at least a portion of data bits included in address 270. As described below in reference to FIG. 6, deselected word lines may be coupled via pass gates or other suitable circuits, to a sense signal 250. During the decode process, a pass gate corresponding a particular deselected word line may be activated, coupling the particular deselected word line to sense signal 250, causing a voltage level of sense signal 250 to be based on a voltage level of the particular deselected word line.

In other cases, designing a decoder for selecting a single one of numerous deselected word lines may be prohibitive from an area standpoint. In such situations, decoder circuit 370 may be configured to select multiple other word lines and combine them together in a wired-OR fashion. For example, two pass gates may be activated in parallel, coupling two deselected word lines to sense signal 250. In some cases, when multiple deselected word lines are coupled to sense signal 250, decoder circuit 370 may be configured to not include the selected word line so that voltage levels of the one or more other word lines does not include a voltage level of a selected word line.

Although a single sense signal is depicted, in other embodiments, decoder circuit 370 is configured to generate, based on address 270, a second sense signal having a voltage level based on voltage levels of another one or more word lines of the array of non-volatile memory cells. As described below with reference to FIG. 4, decoder circuit 370 may include any suitable combination of transistors, pass gates, and the like, configured to select a particular one of multiple deselected word lines.

Figure 4:
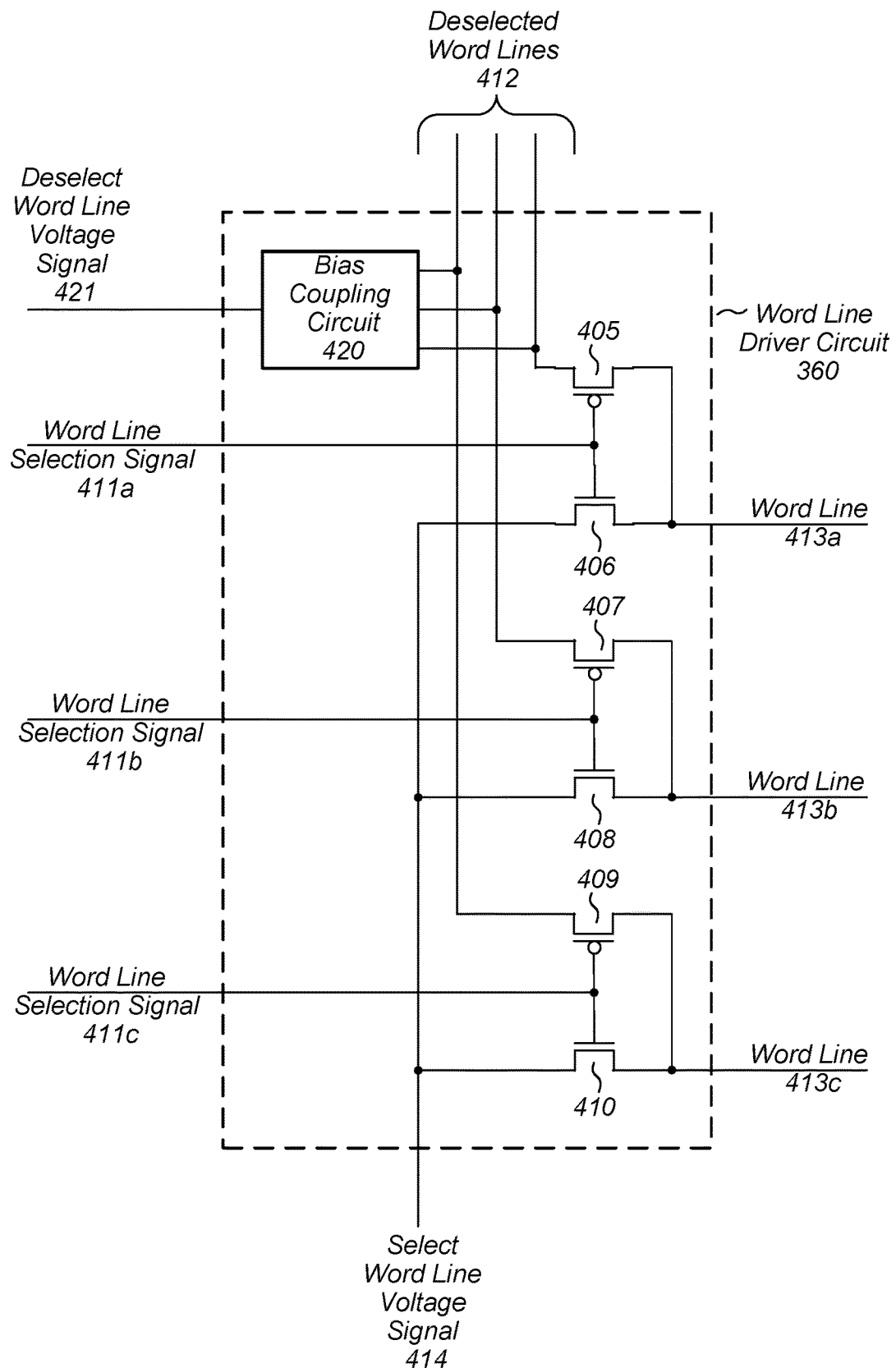
FIG. 4 illustrates a diagram depicting an embodiment of a word line driver circuit.

Turning to FIG. 4, an embodiment of word line driver circuit 360 is depicted. In the illustrated embodiment, word line driver circuit 360 includes bias coupling circuit 420, and transistors 405, 406, 407, 408, 409, and 410. Transistors 405 and 406 are coupled to word line 413a, transistors 407 and 408 are coupled to word line 413b, and transistors 409 and 410 are coupled to word line 413c. In various embodiments, word lines 413a, 413b, and 413c may correspond to word lines 260a-n as illustrated in FIG. 2. It is noted that although only three word lines are depicted, in other embodiments, any suitable number of word lines may be employed.

Control terminals of transistors 405 and 406 are coupled to word line selection signal 411a. In a similar fashion, control terminals of transistors 407 and 408 are coupled to word line selection signal 411b, and control terminals of transistors 409 and 410 are coupled to word line selection signal 411c. In some embodiments, word line selection signals 411a, 411b, and 411c may correspond to word line selection signals 383 as depicted in FIG. 3.

Transistors 405, 407, and 409 are coupled to respective ones of deselected word lines 412, while transistors 406, 408, and 410 are coupled to selected word line voltage signal 414. In various embodiments, selected word line voltage signal 414 may be included in select and deselect signals 384 generated by analog control circuits 350 as illustrated in FIG. 3.

When a memory circuit, such as, e.g., non-volatile memory 200 performs a pre-charge operation prior to accessing a memory cell, voltage levels of each of word line selection signals 411a, 411b, and 411c are set to a voltage level at or near ground potential. This low voltage level on word line selection signals 411a, 411b, and 411c disables transistors 406, 408, and 410, isolating word lines 413a, 413b, and 413c from select word line voltage signal 414. The low voltage level on word line selection signals 411a, 411b, and 411c also enables transistors 405, 407 and 409 providing a conduction path from word lines 413a, 413b, and 413c, to deselected word lines 412. In various embodiments, voltage levels of deselected word lines 412, and word lines 413a, 413b, and 413c, may be set to a voltage level at or near ground potential using select and deselect signals 384.

In response to the memory circuit performing a read operation, a voltage level of one of word line selection signals 411a, 411b, and 411c may be set to a voltage level at or near a voltage level of a power supply signal of the memory circuit. For example, word line selection signal 411a may be set to the voltage level of the power supply signal, while the voltage levels of word line selection signals 411b and 411c remain at a voltage level at or near ground potential. In response to the high voltage level on word line selection signal 411a, transistor 405 is disabled, and transistor 406 is enabled, coupling word line 413a to select word line voltage signal 414. The voltage level of selected word line voltage signal 414 may be set to enable a non-volatile memory cell coupled to word line 413a based on a voltage level of a bit line coupled to the non-volatile memory cell.

While word line 413a is being driven to the voltage level of select word line voltage signal 414, deselected word lines 412 may, in some embodiments, be floated. To float deselected word lines 412, they may be decoupled from a voltage signal. For example, bias coupling circuit 420 may be configured to selectively couple and decouple deselected word lines 412 from deselected word line voltage signal 421.

In various embodiments, bias coupling circuit 420 may include one or more transistors, pass gates, or other suitable circuits.

By floating deselected word lines 412, voltage levels developed on word line 413b and 413c resulting from coupling to word line 413a may be increased since deselected word lines 412 are not being actively driven to a particular voltage level. Since deselected word lines are used in sensing, as described above, an increase in the voltage levels of deselected word lines 412 may improve both speed and accuracy of the sensing process.

As described above, some non-volatile memory cell arrays include one or more array sense lines that may be used during the sensing process. In such embodiments, the array sense lines may be routed by word line driver circuit 360. In a similar fashion to how deselected word lines are coupled to deselect word line voltage signal 421, bias coupling circuit may couple, during a pre-charge operation, deselected word line voltage signal 421 to array sense lines coupled to word line driver circuit 360. Once a particular non-volatile memory cell has been activated, bias coupling circuit 420 may decouple the array sense lines from deselected word line voltage signal 421, allowing the array sense lines to float.

It is noted that each of transistors 405, 407 and may, in various embodiments, correspond to p-channel metal-oxide semiconductor field-effect transistors (MOSFETs), and transistors 406, 408, and 410 may correspond to n-channel MOSFETs. It other embodiments, other suitable transconductance devices may be used instead of MOSFETs.

Figure 5:
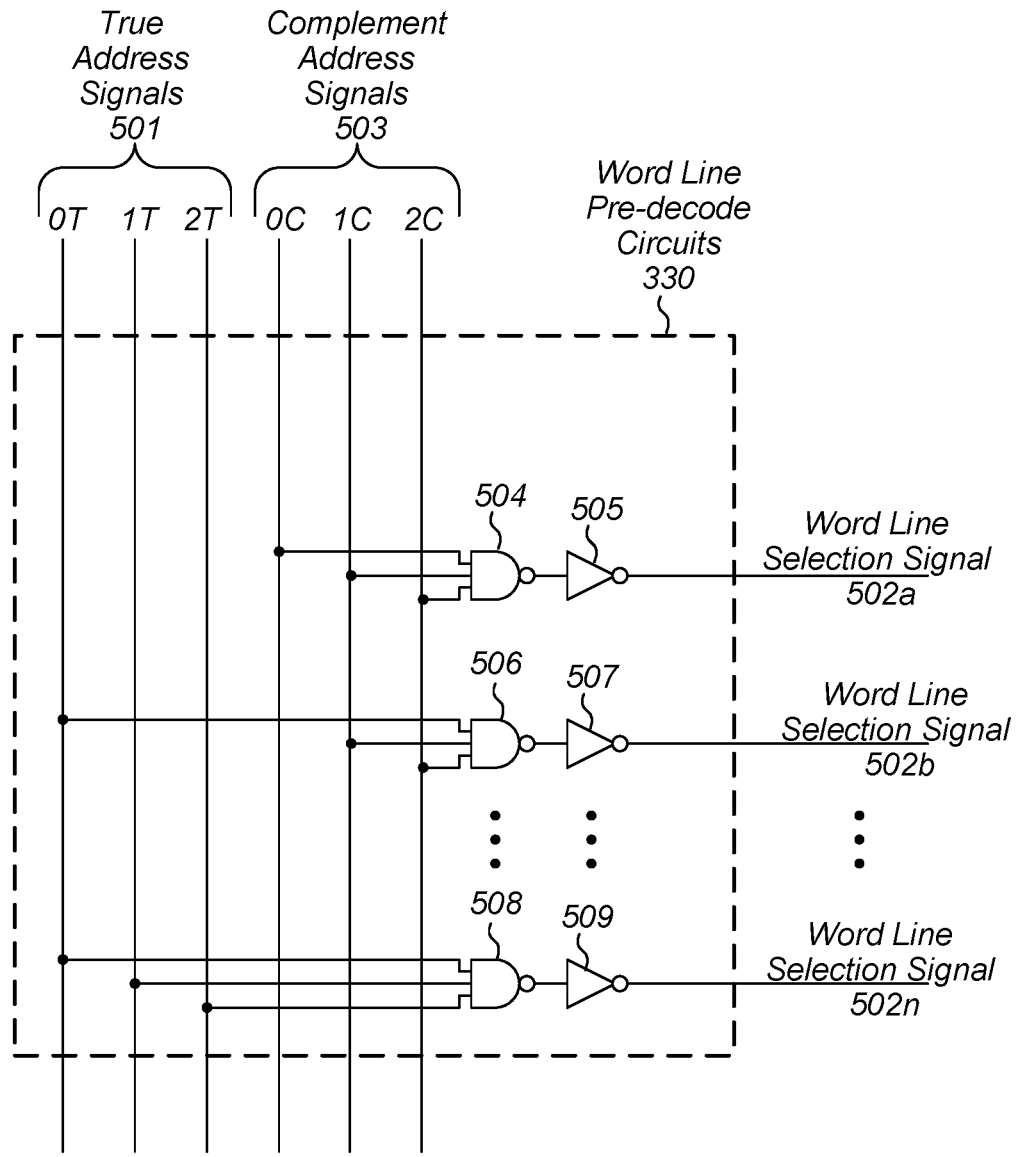
FIG. 5 illustrates a diagram of a word line pre-decode circuit.

In order to drive a particular word line in a non-volatile memory cell array, multiple levels of decoding may be employed to keep a load on any given portion of the decode circuit low. To accomplish this, one or more pre-decode circuits may be employed. A diagram depicting an embodiment of word line pre-decode circuits 330 is illustrated in FIG. 5.

In the illustrated embodiment, word line pre-decode circuits 330 includes NAND gates 504, 506, and 508, and inverters 505, 507, and 509. NAND gate 504 is coupled to inverter 505, and NAND gate 506 is coupled to inverter 507. Moreover, NAND gate 508 is coupled to inverter 509. Each of NAND gates 504, 506, and 508 are coupled to different ones of true address signals 501 and complement address signals 503. In various embodiments, true address signals 501 and complete address signals 503 may be included in latched address signals 381 as illustrated in FIG. 3.

In particular, inputs of NAND gate are coupled to 0C, 1C, and 2C of complement address signals 503. When the logical level of 0C, 1C, and 2C are all high, i.e., the addresses on which the address signals are based are all low, then NAND 504 generates a low logic level on its output, which is, in turn, inverted by inverter 505 to generate a high logic level on word line selection signal 502a. In a similar fashion, the combination of NAND gate 506 and inverter 507 generates logic levels for word line selection signals 502b based on 1C and 2C of complement address signals 503, and 0T of true address signals 501. The combination of NAND gate 508 and inverter 509 generates logic levels for word line selection signal 502n based on 0T, 1T, and 2T of true address signals 501. By connecting the inputs of each NAND gate to different combinations of complement address signals 503 and true address signals 501, the assertion of each of word line selection signals 502a through 502n is unique.

As used and described herein, a high logic level (or simply a "high") refers to a voltage level sufficient to enable an n-channel MOSFET, and a low logic level (or simply a "low") is a voltage level at or near ground potential. In other embodiments, technologies other than complementary metal-oxide semiconductor (CMOS) may be used, resulting in other voltage levels for the high logic level and the low logic level.

It is noted that an inverter, such as those shown and described herein, may be a particular embodiment of a CMOS inverting amplifier. In other embodiments, however, any suitable configuration of inverting amplifier that is capable of inverting the logical sense of a signal may be used, including inverting amplifiers built using technology other than CMOS.

Moreover, a NAND gate, such as those shown and described herein, may be a particular embodiment of a logic circuit configured to perform a negative-AND function using the logic levels on its inputs. Such NAND gates may be implemented using a variety of circuit techniques includes CMOS, transistor-transistor logic (TTL), and the like.

Although the circuit topology depicted in FIG. 5 is described in the context of a word line pre-decode circuit, similar circuit topologies may be used for other decoding circuits, such as bit line pre-decode circuits 320, for example.

Figure 6:
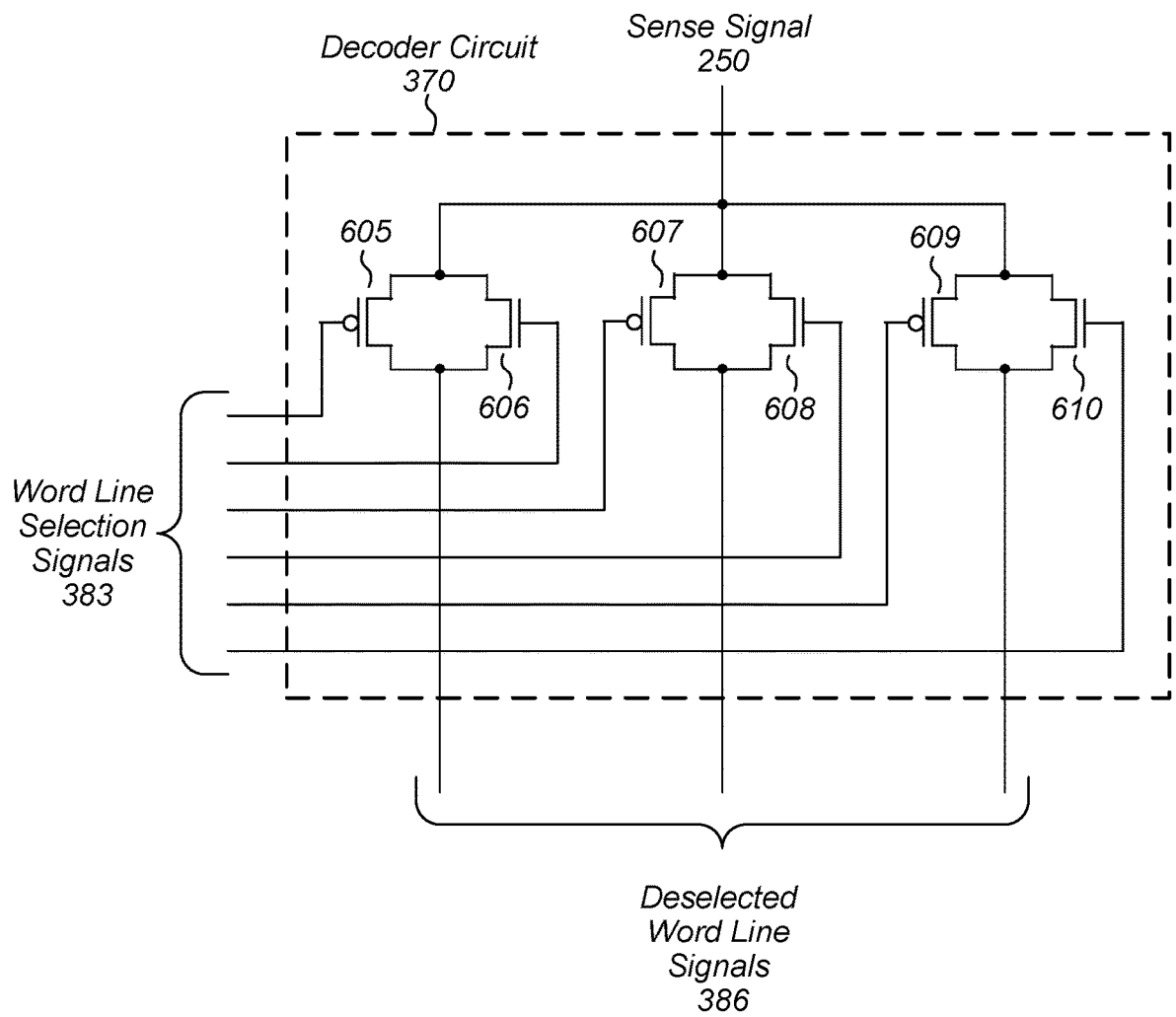
FIG. 6 illustrates a diagram of a decoder circuit.

According to various embodiments of the present disclosure, any deselected word line may be used for sensing a data value. In some cases, however, it may be preferable to use a particular one or more of the deselected word lines for sensing. In such cases, a decoder circuit, such as, e.g., decoder circuit 370, may be employed to pick a particular deselected word line, or lines to use as a sense signal. An embodiment of decoder circuit 370 is illustrated in FIG. 6.

In the illustrated embodiment, decoder circuit 370 includes transistors 605, 606, 607, 608, 609, and 610. Control terminals of transistors 605 through 610 are coupled to respective ones of word line selection signals 383. Transistors 605 and 606 and are both coupled to a particular one of deselected word line signals 386. Additionally, transistors 607 and 608 are both coupled to another one of deselected word line signals 386, while transistors 609 and 610 are both coupled to a third deselected word line signal of deselected word line signals 386. Although three deselected word line signal are described in the present embodiment, in other embodiments, any suitable number of deselected word line signals may be coupled to decoder circuit 370.

Each of transistors 605 through 610 is coupled to sense signal 250. During operation, logic levels of word line selection signals 383 are based upon a value of an address, such as address 270, for example. In response to the logic levels of word line selection signals 383, one pair of transistors 605 through 610 will be enabled, coupling a particular one of deselected word line signals 386 to sense signal 250. The remaining transistors remain disabled, provided a high impedance state between the unused deselected word line signals and sense signal 250. For example, if transistors 605 and 606 are enabled and transistors 607 through 610 are disabled, the particular one of deselected word line signals 386 is coupled to sense signal 250, while the deselected word line signals coupled to transistors 607 through 610 are not coupled to sense signal 250.

It is noted that, in the present embodiment, transistors 605, 607, and 609 may be particular embodiments of p-channel MOSFETs, while transistors 606, 608, and 610 may be particular embodiments of n-channel MOSFETs. In other embodiments, other types of transconductance devices, such as, e.g., junction field-effect transistors (JFETs), may be used for any of transistors 605 through 610.

Some non-volatile memory cell arrays, as described above, include one or more array sense lines that may be used during the sensing process. In such embodiments, the array sense lines may be coupled to decoder circuit 370 in order to be included in the generation of sense signal 250. To accommodate the array sense lines, decoder circuit 270 may include additional transistors coupled between sense signal 250 and the array sense lines. In a similar fashion as described above, additional transistors would be controlled by word line selection signals 383, selectively coupling one or more of deselected word line signals 386 and the array sense lines to sense signal 250.

Figure 7:
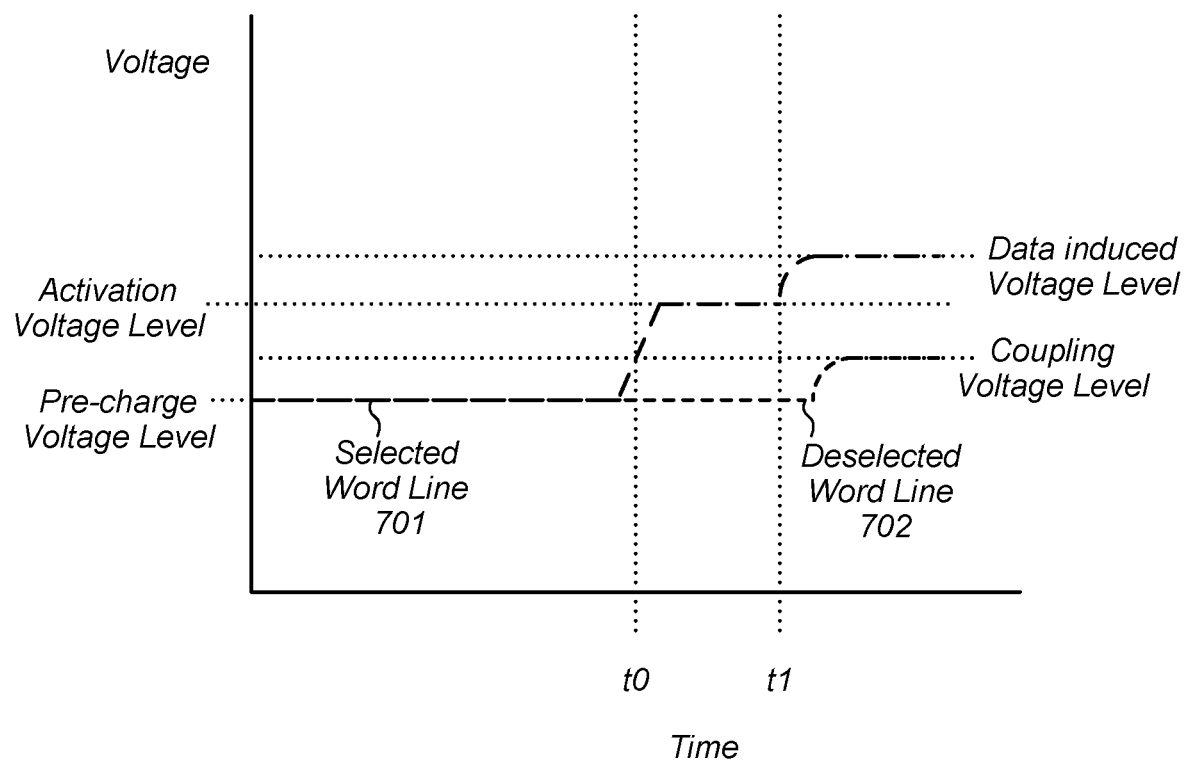
FIG. 7 illustrates example waveforms of a selected word line and an adjacent sense line.

As described above, the activation of a non-volatile memory cell in a non-volatile memory cell array may result a change in a voltage level of word lines other than the word line used to activate the non-volatile memory cell. To further illustrate this, sample waveforms depicting a selected and deselected word line during a read operation are shown in FIG. 7.

Prior to time t0, both selected word line 701 and deselected word line 702 are at a pre-charge voltage level. In various embodiments, the pre-charge voltage level may be at or near ground potential, or any other suitable voltage level.

At time t0, the voltage level of selected word line 701 is transitioned to a non-volatile memory cell activation voltage level. The memory cell activation voltage level may be dependent upon a type of non-volatile memory cell being activated. For example, an activation voltage level for a flash memory cell may be different than an activation voltage level for a phase-change memory cell. The voltage level of deselected word line 702 may remain at the pre-charge voltage level. In some cases, circuitry holding deselected word line 702 at the pre-charge voltage level may be decoupled from deselected word line 702, allowing it to float.

Once selected word line 701 has been activated, the selected non-volatile memory cell will activate at time t1. As the selected non-volatile memory cell activates, the voltage level of selected word line 701 changes based on a data value stored in the selected non-volatile memory cell. In the illustrated waveforms, the stored data value results in an increase in the voltage level of selected word line 701.

The increase in the voltage level of selected word line 701 causes a change in the voltage level of deselected word line 702 due to capacitive and/or inductive coupling between selected word line 701 and deselected word line 702. The magnitude of the change in the voltage level of deselected word line 702 may, in some embodiments, be based on a level of coupling between selected word line 701 and deselected word line 702. Although only a single deselected waveform is depicted in FIG. 7, other deselected word lines may also have voltage level changes, whose magnitudes are based on the level of coupling between the other deselected word lines and selected word line 701. As described above, the change in the voltage level of deselected word line 702 may be used to determine the data value stored in the activated non-volatile memory cell.

Although the waveforms illustrated in FIG. 7 depict an increase in the voltage level of selected word line 701, in other embodiment, a particular data value stored in the activated non-volatile memory cell may result in a decrease in the voltage level, or no change in the voltage level of selected word line 701.

Figure 8:
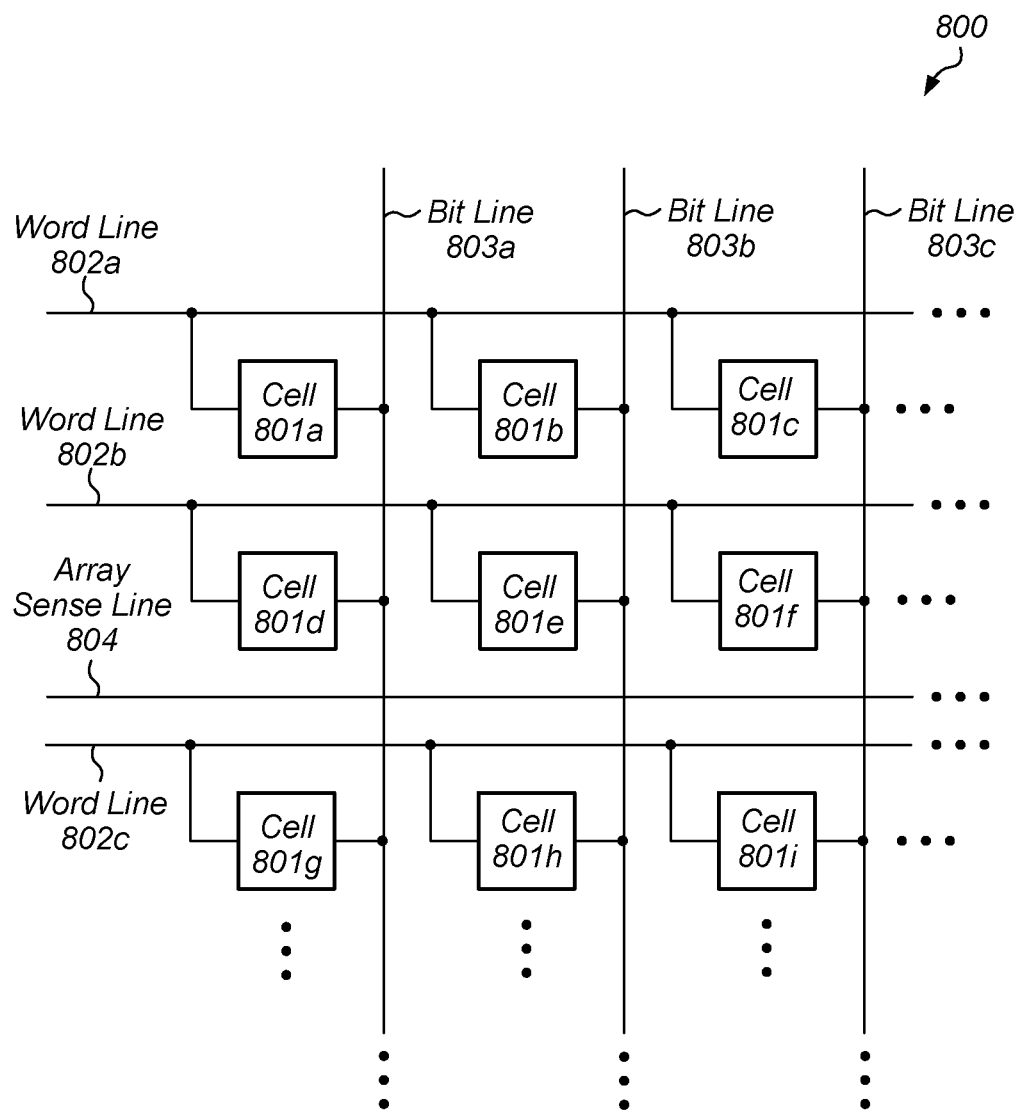
FIG. 8 illustrates a block diagram depicting an embodiment of a memory cell array.

Turning to FIG. 8, an embodiment of a non-volatile memory cell array is illustrated. Non-volatile memory cell array 800 may, in various embodiments, correspond to non-volatile memory cell array 130 or non-volatile memory cell array 230. In the illustrated embodiment, non-volatile memory cell array 800 includes cells 801a through 801i, word lines 802a through 802c, bit line 803a through 803c, and array sense line 804. Word lines 802a through 802c, bit lines 803a through 803c, and array sense line 804 are examples of control lines, as described above. Different combinations of voltage levels on the control lines allow the activation of a particular cell of cells 801a through 801i.

Cells 801a through 801c are coupled to word line 802a, while cells 801d through 801f are coupled to word line 802b. Cells 801g through 801i are coupled to word line 802c. Cells 801a, 801d, and 801g are also coupled to bit line 803a, while cells 801b, 801e, and 801h are coupled to bit line 803b. Cells 801c, 801f, and 801i are coupled to bit line 803c. In this embodiment, to activate a particular cell of cells 801a through 801i, both a word line and bit line are selected. This type of architecture is commonly referred to as a "cross point array." Although a cross point architecture is depicted in FIG. 8, in other embodiments, different connections between cells, word lines, and bit lines, may be employed allowing for NAND-style flash architectures and the like.

It is noted that there are no cells coupled to array sense line 804. As noted above, array sense line 804 is another example of a "control line" for the purposes of the present disclosure. Here, array sense line 804 can be considered to be a "dummy line" since it is not used for activating a non-volatile memory cell. In some embodiments, array sense line 804 is added to non-volatile memory cell array 800 to aid in lithography, while in other cases array sense line 804 is added specifically for its sensing properties. Specifically, a voltage change on array sense line 804 induced by activation of one of cells 801a through 80i is used to determine a data value stored in the activated cell. Although a single sense line is depicted in non-volatile memory cell array 800, in other embodiments, array sense lines may be placed at regular intervals amongst the word lines included in non-volatile memory cell array 800. It is also noted, that in some embodiments, the array sense lines may run in parallel with the bit line as opposed to the word line.

Each of cells 801a through 801i may be a particular embodiment of non-volatile memory cells. For example, cells 801a through 801i may be flash memory cells, magneto resistive memory cells, phase-change memory cells, and the like. Although only nine cells are depicted in non-volatile memory cell array 800, in other embodiments, any suitable number of non-volatile memory cells may be used.

Structures shown with reference to FIGS. 1-8 for sensing a value associated with a non-volatile memory circuit may also be referred to using functional language. In some embodiments, these structures may be described as including "a means for activating a control line associated with a non-volatile data storage cell located in a non-volatile memory array," "a means for selecting a sense signal that is based on at least one other control line of the non-volatile memory array," and "a means for sensing a data value stored in the non-volatile data storage cell using the sense signal." In other embodiments, the structures may also be described as including "a means for activating a word line associated with a non-volatile data storage cell located in a non-volatile array," "a means for selecting a sense signal that is based on at least one other word line of the non-volatile memory array," and "a means for sensing a data value stored in the non-volatile data storage cell using the sense signal."

The corresponding structure for "means for activating" either a word line or a control line includes various components of selection circuit 210 other than decoder circuit 370, as well as the equivalents of these components. For example, in one embodiment, the means for activating includes bit line pre-decode circuits 320, bit line driver circuits 340, word line pre-decode circuits 330, and word line driver circuits 360; in other embodiments, the means for activating may additionally include latch circuits 310 and analog control circuits 350, as well as their equivalents. The corresponding structure for the "means for selecting" either a word line or a control line is decoder circuit 370 and its equivalents. Finally, the corresponding structure for the "means for sensing" is amplifier circuit 220 and its equivalents.

In some instances of the means for activating a control line, the sense signal is selected based on "at least one other control line" of the same type as the control line used in the means for activating—e.g., a word line is used to activate the non-volatile data storage cell and the sense signal selected by the means for selecting is based on at least one other word line of the array. In other cases, by contrast, the sense signal is selected based on "at least one other control line" of a different type from the control line used in the means for activating—e.g., a word line is used to activate the non-volatile data storage cell and the sense signal selected by the means for selecting is based on one or more sense lines of the array. Accordingly, the means for selecting may route word lines or sense lines to the means for sensing in various embodiments.

Figure 9:
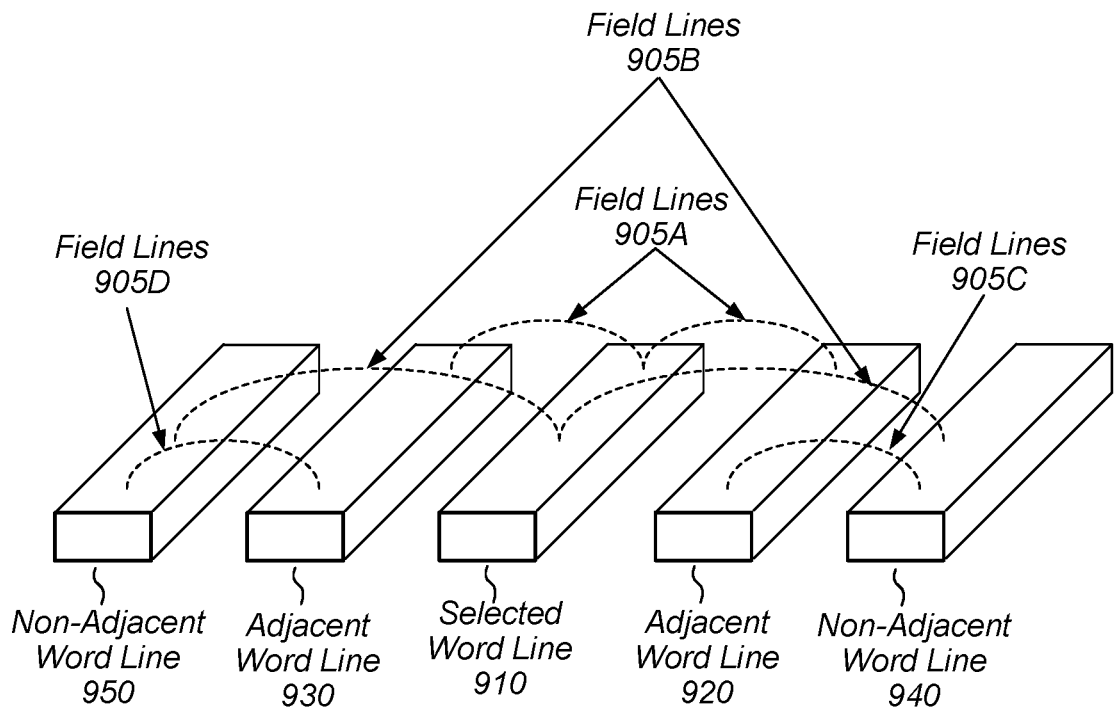
FIG. 9 illustrates a diagram depicting electric field coupling between a selected word line and other word lines both adjacent and non-adjacent to the selected word line.

To further illustrate the coupling between selected and deselected word lines, a block diagram depicting the electric fields between a selected word line, adjacent word lines, and non-adjacent word lines for a portion of a non-volatile memory cell array is illustrated in FIG. 9. Although the portion of the non-volatile memory cell array depicts only five word lines, this is for illustration purposes only, and the description regarding the coupling between word lines can be extended to any suitable number of word lines.

In the illustrated embodiment, changes in a voltage level of selected word line 910 are coupled via field lines 905A to adjacent word lines 920 and 930. As noted, an adjacent word line is a word line physically next to a selected word line with no intervening word lines between the selected word line and the adjacent word line. Thus, there may be adjacent word lines on either side of the selected word line.

The coupling resulting from field lines 905A may induce a change in the voltage levels of adjacent word lines 930 and 920. The magnitude of the voltage change corresponds to an amount of separation between selected word line 910 and adjacent word lines 920 and 930, a common run length between selected word line 910 and adjacent word lines 920 and 930, and a dielectric constant of any material situated between selected word line 910 and adjacent word lines 920 and 930.

In a similar fashion, the change in the voltage level of selected word line 910 may induce a change in voltage levels of non-adjacent word lines 940 and 950 via field lines 905B. As used and described herein, a non-adjacent word line is a word line that has at least one other word line between itself and a selected word line. As with adjacent word lines, there can be multiple non-adjacent word lines on each side of a selected word line. Like the case with adjacent word lines, the magnitude of the voltage change on non-adjacent word lines 940 and 950 may depend on the distance between selected word line 910 and non-adjacent word lines 940 and 950, as well as the other factors described above.

When changes in voltage levels are induced on adjacent word lines 920 and 930, those changes may induce further changes on non-adjacent word lines 940 and 950. For example, a change in the voltage level of adjacent word line 920 may induce a change in the voltage level of non-adjacent word line 940 via field lines 905C, and a change in the voltage level of non-adjacent word line 930 may induce a change in the voltage level of non-adjacent word line 950 via field lines 905D. This process of coupling the voltage changes may continue throughout the word lines of a non-volatile memory cell array, such as, e.g., non-volatile memory cell array 230, with each induced voltage level decreasing.

It is noted that field lines 905A through 905D have been simplified for clarity, and may represent electric field lines, magnetic field lines, or a combination thereof.

Figure 10A:
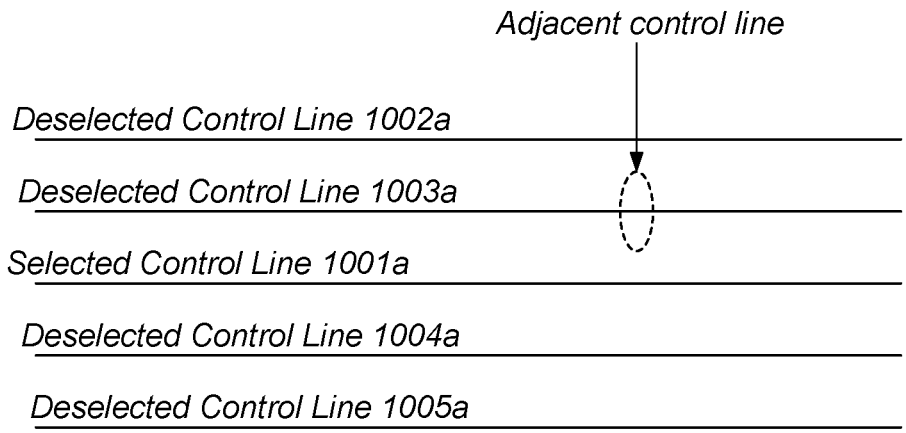
FIG. 10A depicts the use of an adjacent control line to determine a data value stored in a non-volatile memory cell.
Figure 10B:
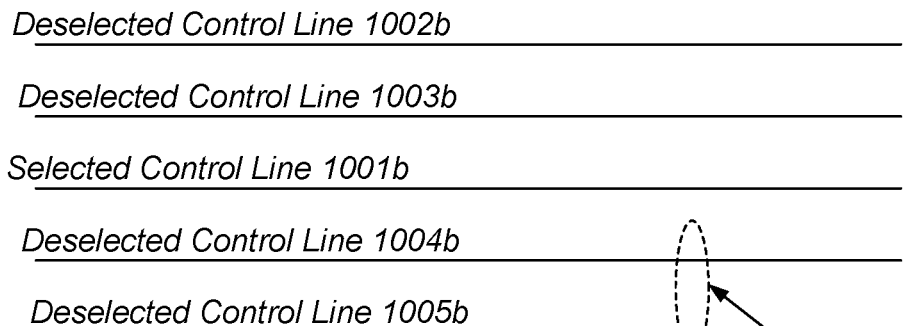
FIG. 10B depicts the use of an adjacent group of control lines to determine a data value stored in a non-volatile memory cell.
Figure 10C:
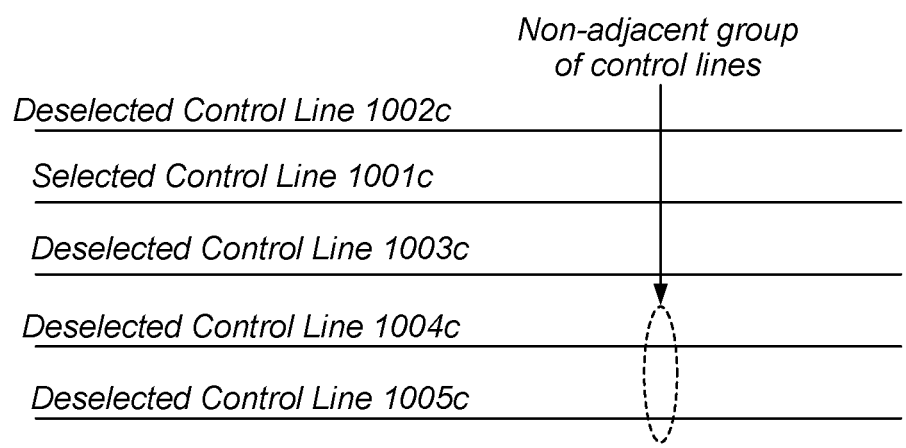
FIG. 10C depicts the use of a non-adjacent group of control lines to determine a data value stored in a non-volatile memory cell.

Turning to FIG. 10A through FIG. 10C, block diagrams depicting the use of different control lines to sense a data value in an activated non-volatile memory cells are illustrated.

More generally, as described throughout this disclosure, control lines other than those used to activate a non-volatile memory cell may be used to sense a data value of such a cell. FIGS. 10A-10C depict different examples of such other control lines. In these figures, the depiction of the control lines implies physical adjacency. For example, the representation of control line 1003a between control lines 1001a and 1002a implies that control line 1003a is physically located between 1001a and 1002a.

FIG. 10A depicts the use of a single control line adjacent to a selected control line to sense a data value. In the example depicted in FIG. 10A, selected control line 1001a is coupled to the activated non-volatile memory cell and the resultant change in voltage level of deselected control line 1003a is used to determine a data value of the activated non-volatile memory cell. In this example, none of deselected control lines 1002a, 1004a, and 1005a, or selected control line 1001a, are used to determine the data value.

In another example depicted in FIG. 10B, each of the control lines adjacent to selected control line 1001a (i.e., deselected control lines 1003b and 1004b) are used to sense the data value of the activated non-volatile memory cell. In this example, deselected control lines 1002b and 1005b, as well as selected control line 1001b, are not used to sense the data value of the cell. Note that, in other embodiments, the selected control lines 1001 in FIGS. 10A and 10B may be used in combination with the indicated deselected control lines in order to sense the data value of the activated memory cell.

In other cases, multiple control lines (also referred to herein as "groups" or "pluralities" of control lines) may be used to determine a data value of an activated non-volatile memory cell.

FIG. 10C illustrates the use of an adjacent group of control lines that includes deselected control line 1004c and deselected control line 1005c. Deselected control line 1004c is adjacent to selected control line 1001c, therefore, the group in which deselected control line 1004c is included, is considered an adjacent group of control lines with respected to control line 1001c for purposes of this disclosure. Although a single adjacent group of control lines is depicted in FIG. 10C, in other cases, another adjacent group of control lines on the other side of selected control line 1001c (e.g., deselected control lines 1002c and 1003c) may also be used in combination with the illustrated adjacent group of control lines. In the example illustrated in FIG. 10C, though, none of deselected control lines 1002c and 1003c, or selected control line 1001c, is used to sense the data value.

In other examples (not depicted), one or more control lines that are non-adjacent to a selected control line may be used to sense a data value. For example, in FIG. 10A, deselected control line 1005a is non-adjacent to selected control line 1001a because there is an intervening control line (1004a). But in some embodiments, non-adjacent control line 1005a may be used either alone or in combination with other non-adjacent control lines in order to sense a data value. For purposes of this disclosure, a group of control lines is considered to be "non-adjacent" to a particular control line if none of the control lines in the group are adjacent to the particular control line.

As described above, amplifier circuit 220 is configured to generate data value 280 based on a comparison of sense signal 250 and reference signal 240. In some cases, however, multiple sense signals may be used to generate data value 280. By employing more than one sense signal, a magnitude of a signal indicative of data stored in a given non-volatile memory cell may be increased, thereby improving the signal-to-noise ratio allowing for faster and more accurate sensing of stored data.

Figure 11:
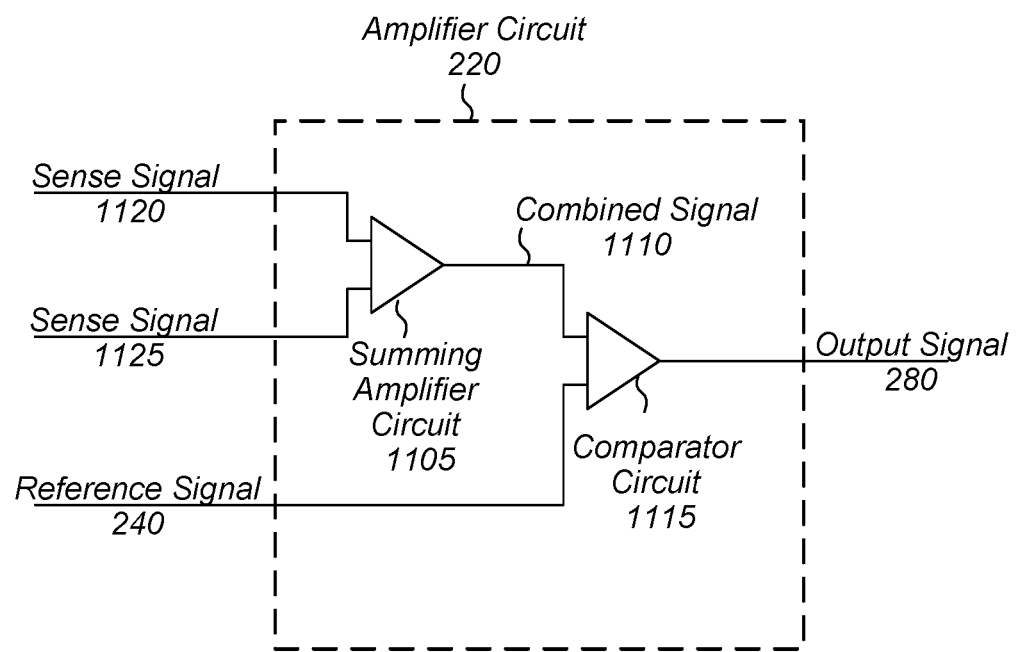
FIG. 11 illustrates a block diagram of an embodiment of an amplifier circuit.

A block diagram of an embodiment of amplifier circuit 220 is illustrated in FIG. 11. In the illustrated embodiment, amplifier circuit 220 includes summing amplifier circuit 1105 and comparator circuit 1115.

Summing amplifier circuit 1105 may be configured to combine voltage levels of sense signal 1120 and sense signal 1125 to generate a voltage level of combined signal 1110. In various embodiments, voltage levels of sense signal 1120 and sense signal 1125 may correspond to voltage levels of control lines included in a non-volatile memory cell array, such as memory cell array 230, for example. Such control lines may both be included in a common adjacent control line group, or may be included in respective control line groups located on different sides of a selected control line.

In various embodiments, summing amplifier circuit 1105 may be a particular embodiment of an operational amplifier or other suitable amplifier circuit capable of summing voltage levels of input signals to generate a voltage level of an output signal. In some cases, summing amplifier circuit 1105 may be configured to have variable gain. The gain of summing amplifier circuit 1105 may be adjusted based on operating conditions, such as, e.g., voltage level of a power supply signal, temperature, and the like, of a memory circuit or performance requirements. In various embodiments, the gain of summing amplifier circuit 1105 may be set during testing performed post-manufacture, or may be software-programmable during operation.

Comparator circuit 1115 is configured to compare a voltage level of combined signal 1110 to a voltage level of reference signal 240 to generate data value 280. The voltage level of combined signal 1110 may be indicative of a data value stored in a non-volatile or other type of memory cell. In various embodiments, comparator circuit 1115 may be a particular embodiment of a differential amplifier or other suitable amplifier circuit capable of amplifying a difference between two voltage levels. As with summing amplifier circuit 1105, comparator circuit 1115 may also be configured to have variable gain.

It is noted that both summing amplifier circuit 1105 and comparator circuit 1115 may use additional bias or reference signals (not shown) to set operating points. Additionally, both summing amplifier circuit 1105 and comparator circuit 1115 may be deactivated or disabled using control signals (also not shown) to reduce power dissipation of a memory circuit when the summing amplifier circuit 1105 and comparator circuit 1115 are not in use.

The embodiment of amplifier circuit 220 illustrated in FIG. 11 is an example. In other embodiments, other suitable circuit capable of combining multiple sense signals and comparing a result of the comparison to a reference signal may be employed.

As described above, a non-volatile memory circuit is capable of storing data in the absence of power being applied to the non-volatile memory circuit. Various techniques may be employed to generate different states within the circuit that can be maintained once power is no longer being applied to the circuit. For example, in some cases, electrons may be trapped in a floating-gate structure, which can affect a threshold voltage of a transistor.

Figure 12:
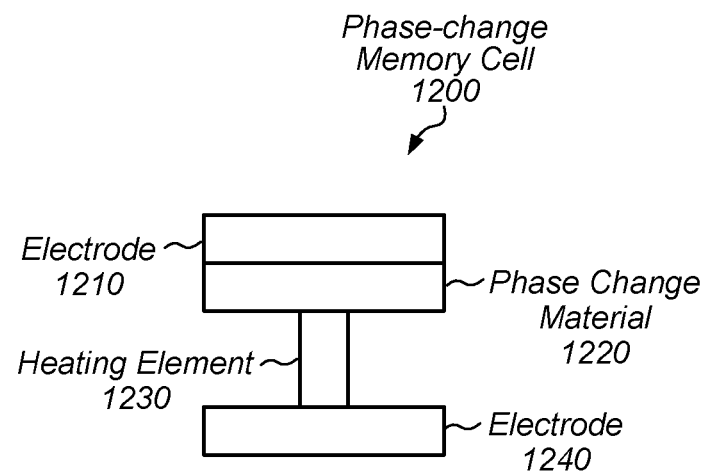
FIG. 12 illustrates a block diagram of an embodiment of a phase-change memory cell.

Another technique that may be employed is the use of a material that can switch between different phases. Memory cells that rely on a phase-change of a material are commonly referred to as phase-change memory cells. A block diagram depicting an embodiment of a phase-change memory cell is illustrated in FIG. 12.

In the illustrated embodiment, phase-change memory cell 1200 includes electrode 1210, phase-change material 1220, heating element 1230, and electrode 1240. In various embodiments, phase-change memory cell 1200 may correspond to any of cells 801a through 801i and may be used in either of non-volatile memory cell array 130 or memory cell array 230.

Electrode 1210 and electrode 1240 are used to couple phase-change memory cell 1200 to control lines in the memory array. For example, electrode 1210 may be coupled to a bit line, while electrode 1240 may be coupled to word line. Electrode 1210 and electrode 1240 may be fabricated out of a metal, such as, e.g., aluminum, that is available in a semiconductor manufacturing process.

Phase-change material 1220 is a material that is capable of switching between at least two phases, each stage having a different resistivity. For example, phase-change material 1220 may switch between a polycrystalline state and an amorphous state, and may include, without limitation, various chalcogenides, such as germanium antimony, antimony telluride, and the like. The difference in resistivity may be used to determine a data value stored in phase-change memory 1200. It is noted that in some embodiments, phase-change material 1220 may transition between more than two states, allowing the storage of multiple data bits per memory cell.

Heating element 1230 includes an electrically conductive material that dissipates heat when a current is passed through it. In various embodiments, heating element 1230 may be fabricated using carbon, titanium nitride, tantalum nitride, and the like. It is noted that the material selected for heating element 1230 is chemically inert with respect to phase-change material 1220, electrode 1210 and electrode 1240.

To store a data value in phase-change memory cell 1200 a switching current pulse is applied between electrode 1210 and electrode 1240. The switching current pulse causes heating element 1230 to dissipate heat, which, in turn, induces a phase-change in at least a portion of phase-change material 1220, resulting in a change in the resistivity of phase-change material 1220. Once programmed, the programmed state of phase-change memory cell 1200 may be determined by applying a voltage level on one of electrode 1210 or electrode 1240 via a control line, as described above.

It is noted that the embodiment of phase-change memory cell 1200 is merely an example. In other embodiments, different shapes of the various elements, as well as different materials, may be employed.

Figure 13:
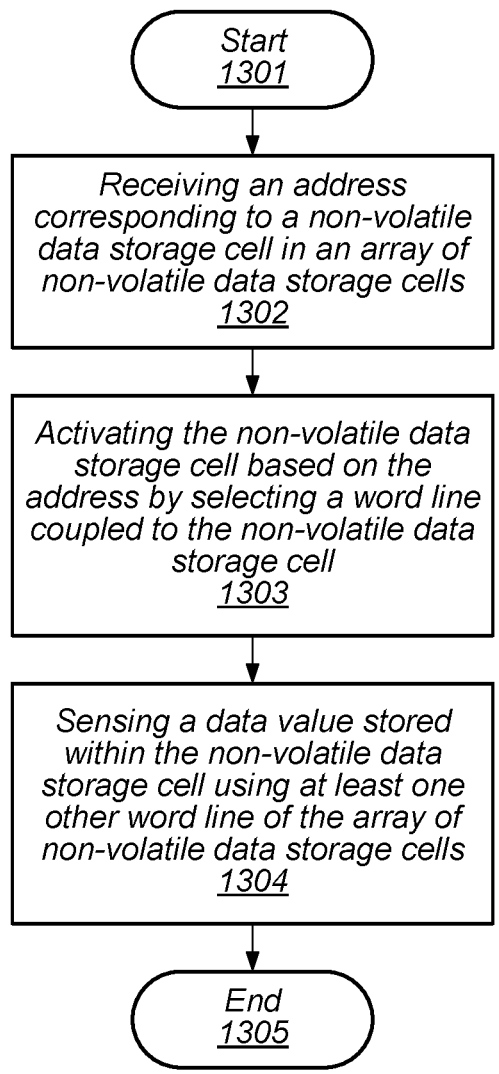
FIG. 13 illustrates a flow diagram depicting an embodiment of a method for sensing data stored in a non-volatile memory cell.

A flow diagram illustrating an embodiment of a method for operating a non-volatile memory circuit is depicted in FIG. 13. The method, which begins in block 1301, may be applied to non-volatile memory circuit 100, non-volatile memory circuit 200, or any other suitable non-volatile memory circuit configured to operate in a similar fashion.

The method includes receiving an address corresponding to a non-volatile memory cell in an array of non-volatile memory cells (block 1302). In various embodiments, one or more non-volatile memory cells included in an array of non-volatile memory cells are mapped to a particular value of address. By varying the value of the address, different non-volatile memory cells may be access for storing data or retrieving previously stored data. For example, a particular value of address 270 corresponds to non-volatile memory cell 235 of non-volatile memory cell array 230.

The method also includes activating the non-volatile memory cell based on the address by selecting a word line coupled to the non-volatile memory cell (block 1303). As described above, an address value received by a non-volatile memory circuit may be latched and pre-decoded. Using the results of the pre-decoding, a set of control lines, possibly including a word line and a bit line may be selected. For example, selection circuit 210 may decode address 270, and based on a result of the decoding, activate a particular one of word line 260a, 260b, and 260n.

The method further includes sensing a data value stored within the non-volatile memory cell using at least one other word line of the array of non-volatile memory cells (block 1304). When a non-volatile memory cell is activated, it may create a change in a voltage level on control lines coupled to the non-volatile memory cell. In some cases, the change in voltage level may occur on a word line coupled to the non-volatile memory cell, while in other cases, the change in voltage level may occur on a bit line coupled to the non-volatile memory cell. The change in voltage level may be coupled to other control lines within the non-volatile memory cell array, which can be used to sense the data value.

In some embodiments, sensing the data value stored within the non-volatile memory cell includes selecting the at least one other word line based on the address and coupling the at least one other word line to an amplifier circuit as a coupling signal. As used and described herein, a coupling signal is a signal generated on a particular control line of a non-volatile memory cell array resulting from a change in voltage level of another control line of a non-volatile memory cell array coupling to the particular control line capacitively and/or inductively. In some cases, a single coupling signal may be used as a sense signal, or multiple coupling signals may be combined to form a sense signal. Just as the address is used to select a particular non-volatile memory cell, using a subset of data bits included in the address, one or more word lines in a similar physical location within the non-volatile memory cell array may also be selected using a further subset of data bits included in the address. The identified word lines may be coupled to an amplifier circuit using a decoder or other suitable circuit. In some cases, the at least one other word line includes at least one word line adjacent to the selected word line, and sensing the data value is not based on a voltage level of the selected word line.

The method may also include setting each word line of a plurality of word lines, in the array of non-volatile memory cells, to a particular voltage level, in response to a pre-charge operation, subsequently setting the word line to another voltage level greater than the particular voltage level in order to select the word line, and floating the at least one other word line, in response to selecting the word line. In some cases, the particular voltage level may be a voltage level at or near ground potential, or any other suitable voltage level that does not activate any non-volatile memory cells included in the non-volatile memory cell array.

In some cases, floating the at least one other word line includes decoupling the at least one other word line from the particular voltage level. As described above, selection circuit 210 may include circuits configured to generate the particular voltage level, which is applied to word lines 260a, 260b, and 260n during the pre-charge operation. When the at least one word line is floated, the circuits generating the particular voltage level are decoupled from the at least one word line. By floating the at least one word line, the voltage level of the at least one word line is more easily changed, in response to coupling from the selected word line. The method may then conclude in block 1305.

It is noted that that while the embodiment of the method depicted in the flow diagram of FIG. 13 specifically references word lines, the described method is also applicable to array control lines, such as those illustrated in FIG. 1.

Figure 14:
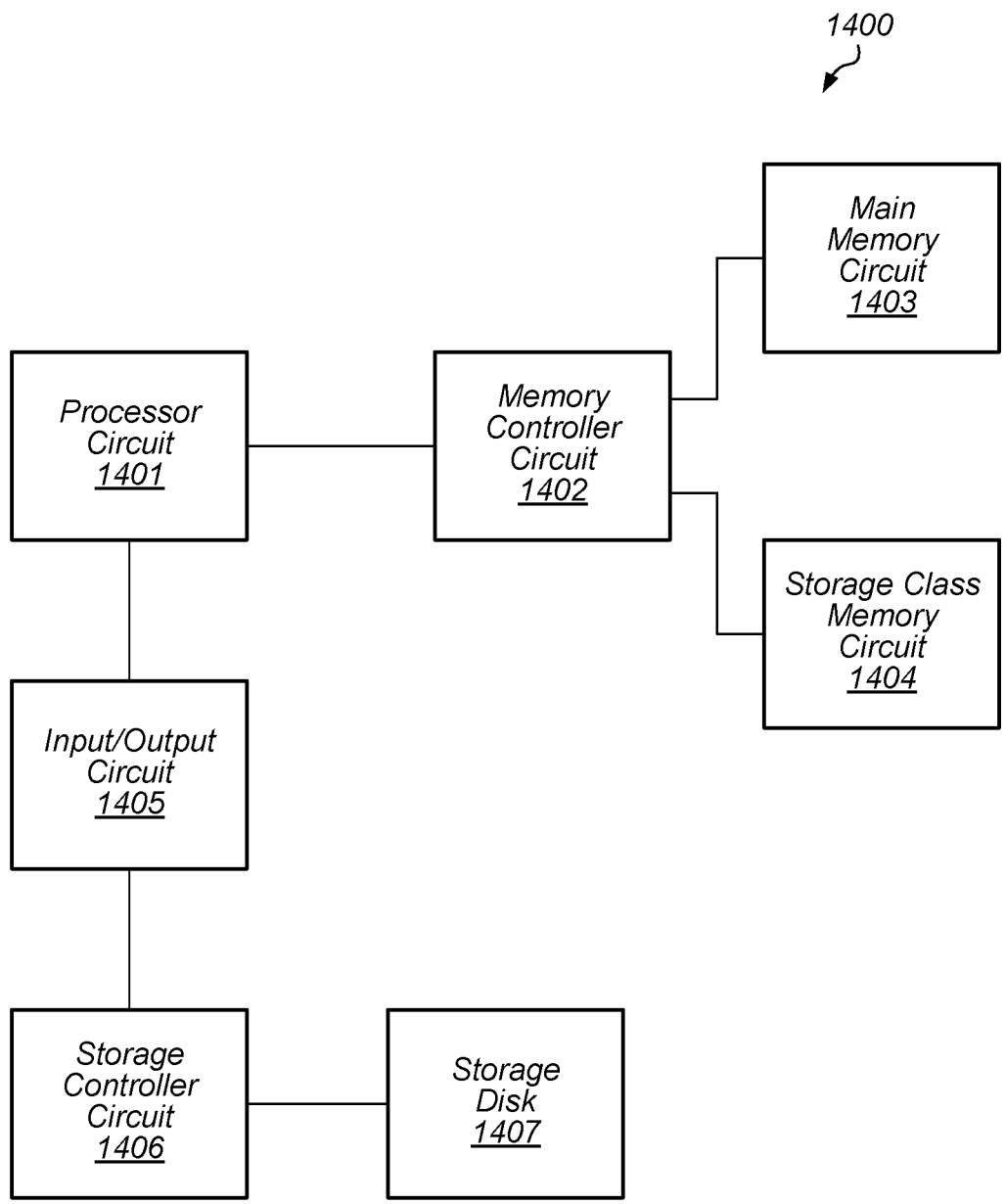
FIG. 14 illustrates a block diagram depicting an embodiment of a computer system employing a storage class memory.

A block diagram of computer system is illustrated in FIG. 14. In the illustrated embodiment, computer system 1400 includes processor circuit 1401, memory controller circuit 1402, main memory circuit 1403, storage class memory circuit 1404, input/output circuit 1405, storage controller circuit 1406, and storage disk 1407. In various embodiments, computer system 1400 may be configured for use in a desktop computer, server, or in a mobile computing application such as a tablet, or laptop computer, for example. Although seven circuit blocks are depicted in the embodiment of FIG. 14, in other embodiments, any suitable number of circuit blocks may be included in computer system 1400.

Processor circuit 1401 may, in various embodiments, be representative of a general-purpose processor that implements a particular instruction set architecture (ISA) and performs computational operations. For example, processor circuit 1401 may be a central processing unit (CPU) such as a microprocessor, a microcontroller, an application-specific integrated circuit (ASIC), or a field-programmable gate array (FPGA).

Memory controller circuit 1402 is configured to schedule access requests to main memory circuit 1403 and storage class memory circuit 1404. Such access requests may include both memory read access requests and memory write access requests, and may be received from processor circuit 1401, input/output circuit 1405, or any other suitable circuit block included in computer system 1400. To schedule a particular access request to either of main memory circuit 1403 or storage class memory circuit 1404, memory controller circuit 1402 may send one or more commands to either main memory circuit 1403 or storage class memory 1403 to activate their respective internal circuit such as selection circuit 210. The one or more commands may specify a type of access, such as, e.g., a read access, as well as include address information and write data (for write access requests). Memory controller circuit 1402 may be implemented according to one of various design styles. For example, memory controller circuit 1402 may include one or more state machines or sequential logic circuits, a general-purpose processor circuit executing software or program instructions, or any other suitable circuit.

Main memory circuit 1403 may include any suitable type of memory such as a Dynamic Random-Access Memory (DRAM), a Static Random-Access Memory (SRAM), a Read-only Memory (ROM), Electrically Erasable Programmable Read-only Memory (EEPROM), or a non-volatile memory, for example. It is noted that in the embodiment of an integrated circuit illustrated in FIG. 14, a single main memory circuit is depicted. In other embodiments, any suitable number of main memory circuits may be employed.

Storage class memory circuit 1404 may, in some embodiments, be a particular embodiment of a persistent or non-volatile memory. In various embodiments, storage class memory circuit 1404 may have slower access times than memory circuit 1403, and may be addressed at the byte or block level, providing software developers additional flexibility. For example, operating system software may treat storage class memory circuit 1404 as a block storage device formatted to be compatible with a particular file system or database.

In various embodiments, storage class memory 1404 may include any suitable non-volatile memory circuit. For example, in some cases, storage class memory 1404 may include non-volatile memory circuit 100 or non-volatile memory circuit 200, configured to be byte-addressable. Although a single storage class memory circuit is depicted in the embodiment illustrated in FIG. 14, in other embodiments, multiple storage class memory circuits may be included in any suitable location within computer system 1400.

Input/output circuit 1405 may be configured to coordinate data transfer between computer system 1400 and one or more peripheral devices. Such peripheral devices may include, without limitation, video processing subsystems, audio processing subsystems, or any other suitable type of peripheral devices. In some embodiments, input/output circuit 1405 may be configured to implement a version of Universal Serial Bus (USB) protocol or IEEE 1394 (Firewire®) protocol.

Input/output circuit 1405 may also be configured to coordinate data transfer between computer system 1400 and one or more devices (e.g., other computing systems or integrated circuits) coupled to computer system 1400 via a network. In one embodiment, input/output circuit 1405 may be configured to perform the data processing necessary to implement an Ethernet (IEEE 802.3) networking standard such as Gigabit Ethernet or 10-Gigabit Ethernet, for example, although it is contemplated that any suitable networking standard may be implemented.

Storage controller circuit 1406 may be configured to coordinate data transfer to and from storage disk 1407. In various embodiments, storage controller circuit 1406 may receive requests to retrieve data from or store data to storage disk 1407. Such requests may come from processor circuit 1401 via input/output circuit 1405. Storage controller circuit 1406 may be configured to schedule, and then send the scheduled requests via a version of the USB protocol, peripheral component interface (PCI), or any other suitable interface. In various embodiments, storage controller circuit 1406 may be implemented as one or more state machines or sequential logic circuits, or a general-purpose processor circuit executing software or program instructions.

Storage disk 1407 is configured to store and retrieve previously stored data from a non-transitory storage medium, in response to requests from storage controller circuit 1406. In various embodiments, storage disk 1407 may include, without limitation, a CD-ROM, hard-disk drive, tape device, or solid-state drive. Storage disk 1407 may be configured to implement a redundancy or error correction protocol when storing data.

It is noted that computer system 1400 is merely an example. In other embodiments, computer system 1400 may include additional circuits blocks, such as, e.g., a power management circuit block, and may employ different connections between circuit blocks.

Figure 15:
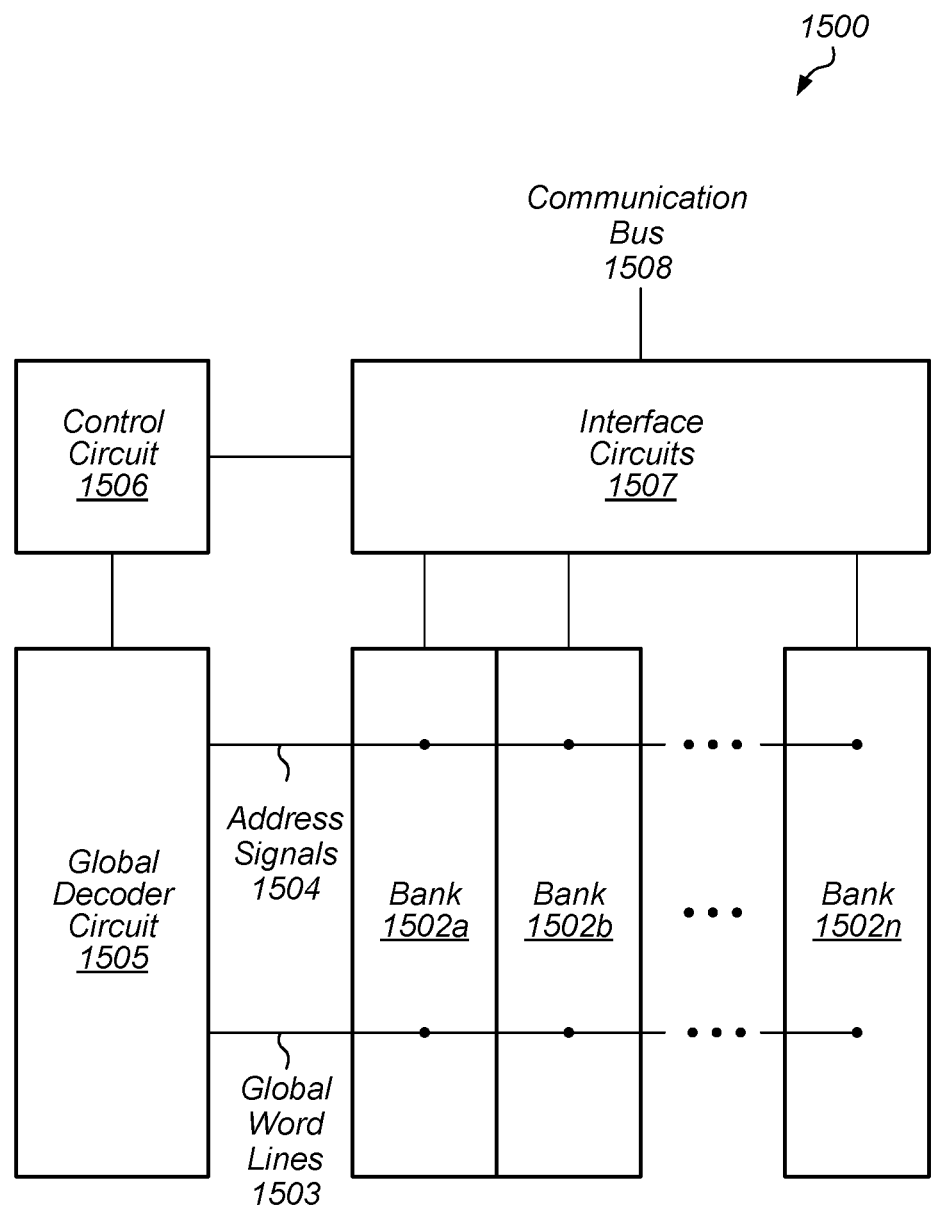
FIG. 15 illustrates a block diagram depicting an embodiment of a storage class memory.

Turning to FIG. 15, a block diagram depicting an embodiment of a storage class memory is illustrated. In various embodiments, storage class memory circuit 1500 may correspond to storage class memory circuit 1404 as illustrated in FIG. 14. In the illustrated embodiments, storage class memory circuit 1500 includes banks 1502a, 1502b, and 1502n, global decoder circuit 1505, control circuit 1506, and interface circuit 1507.

Each of banks 1502a, 1502b, and 1502n is configured to store data using non-volatile memory cells, such as phase-change memory cells. In various embodiments, banks 1502a, 1502b, and 1502n, may be configured to use one or more control lines to sense data store in the non-volatile memory cells, in a similar fashion as described above in regard to non-volatile memory circuit 100 and non-volatile memory circuit 200. Banks 1502a, 1502b, and 1502n may include decoder circuits, pre-decoder circuits, amplifier circuits, and analog control circuits as illustrated in FIG. 3.

To support byte-addressing, banks 1502a, 1502b, and 1502n may be configured to allow each bank to be activated in parallel, with each bank retrieving a respective portion, such as, e.g., a single data bit, of a byte of data. As used and described herein, a byte of data refers to a collection of data bits, such as 8-bits, for example. Although the embodiment illustrated in FIG. 15 depicts three banks, in other embodiments, any suitable number of banks to support byte-addressing may be employed.

During operation, each of banks 1502a, 1502b, and 1502n may activate respective non-volatile memory cells using address signals 1504 and global word lines 1503. In various embodiments, banks 1502a, 1502b, and 1502n, may sense data values stored in the activate non-volatile memory cells using one or more control lines includes in the banks (not shown). In response to a write operation, banks 1502a, 1502b, and 1502n may receive data to be stored from interface circuits 1507, and store the received data in the activated non-volatile memory cells. In response to a read operation, banks 1502a, 1502b, and 1502n, may send sensed data values to interface circuits 1507 for transmission to a circuit block that generated the read request.

Interface circuits 1507 are configured to receive access requests via communication bus 1508. Such requests, which may include read and write requests, may be received from a memory controller circuit, such as memory controller circuit 1402. In some embodiments, received requests specify a command, i.e., read or write, an address indicating a location with storage class memory circuit 1500, and data to be stored, if applicable.

Upon completion of a particular request, interface circuits 1507 may send an acknowledgement, via communication bus 1508, to the circuit block that generated the request, indicating that the request has been completed. In the case of read requests, interface circuits 1507 may send the request data, via communication bus 1508, to the circuit block that generated the request.

Global decoder circuit 1505 is configured to receive address information included in an access request from control circuit 1506. Global decoder circuit 1505 is further configured to generate address signals 1504 and global word lines 1503 using the address information. In various embodiments, global decoder circuit 1505 may include multiple latch circuits configured to store the address information included in the access request to generate address signals 1504, which are further decoded by banks 1502a, 1502b, and 1502n. Additionally, global decoder circuit 1505 may include one or more decoder circuits configured to decode a portion of the received address information to generate global word lines 1503. In various embodiments, global word lines 1503 may enable specific ones of banks 1502a, 1502b, and 1502n, when the access request does not specify access to all of the banks included within storage class memory circuit 1500.

Control circuit 1506 is configured to monitor and control the operation of storage class memory circuit 1500. When storage class memory circuit 1500 receives an access request from a memory controller circuit, such as, e.g., memory controller circuit 1402, a control circuit 1506 is activated. Once activated, control circuit 1506 may enable decoding circuits, amplifier circuits, reference and bias circuits, and the like. In some cases, a circuit such as selection circuit 210 inside control circuit 1506 may generate one or more internal clock signals that are by global decoder circuit 1505, banks 1502a, 1502b, and 1502n, and interface circuits 1507 to perform various atomic operations as part of performing an access request.

Control circuit 1506 may be implemented using a variety of circuits. For example, in some embodiments, control circuit 1506 may include one or more state machines or sequential logic circuits, timing circuits (including phase-locked loop circuits or delay-locked loop circuits), decoder circuits, and the like.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    an array of non-volatile memory cells including a non-volatile memory cell that is coupled to a word line;
    a selection circuit configured to select, based on an address corresponding to the non-volatile memory cell, the word line to activate the non-volatile memory cell; and
    an amplifier circuit configured to sense a data value stored in the non-volatile memory cell using a sense signal that is based on sensing one or more other word lines of the array of non-volatile memory cells.

2. The apparatus of claim 1, wherein the selection circuit is further configured, in response to selecting the word line and prior to selecting the sense signal, to float the one or more other word lines used to generate the sense signal.

3. The apparatus of claim 2, wherein the selection circuit includes an analog control circuit configured to generate a select bias signal for selected word lines and a deselect bias signal for deselected word lines;
    wherein the selection circuit is further configured to:
    couple each word line of the array of non-volatile memory cells to the deselect bias signal as part of a pre-charge operation;
    subsequently couple the particular word line to the select bias signal, in response to selecting the word line; and
    float the one or more other word lines by decoupling the one or more other word lines from the deselect bias signal, in response to selecting the word line.

4. The apparatus of claim 1, wherein the selection circuit is further configured to generate the sense signal based on voltage levels of the one or more other word lines, but not on a voltage level of the word line.

5. The apparatus of claim 1, wherein each of the one or more other word lines is adjacent to the word line.

6. The apparatus of claim 1, wherein the one or more other word lines include a first plurality of word lines adjacent to one side of the word line.

7. The apparatus of claim 1, wherein the selection circuit is further configured to generate the sense signal based on voltage levels of the one or more other word lines and also on a voltage level of the word line.

8. The apparatus of claim 1, wherein the array of non-volatile memory cells are phase-change memory cells, and wherein the array of non-volatile memory cells is arranged such that a given non-volatile memory cell of the array of non-volatile memory cells is coupled to a corresponding one of word lines of the array of non-volatile memory cells and a corresponding one of a plurality of bit lines.

9. The apparatus of claim 1, wherein the selection circuit includes a decoder circuit configured to select, based on the address, a second sense signal having a voltage level based on voltage levels of one or more other word lines of the array of non-volatile memory cells, and wherein the amplifier circuit is further configured to sense the data value stored in the non-volatile memory cell based on the sense signal and the second sense signal.

10. The apparatus of claim 1, wherein the array of non-volatile memory cells includes at least one array sense line that is not coupled to any non-volatile memory cells) The apparatus of claim 1, wherein the one or more other word lines include a first plurality of word lines adjacent to one side of the word line.

* * * * *